(12) United States Patent
Lee et al.

(10) Patent No.: US 12,507,516 B2
(45) Date of Patent: Dec. 23, 2025

(54) DISPLAY DEVICE AND METHOD OF MANUFACTURING THE SAME

(71) Applicant: Samsung Display Co., Ltd., Yongin-si (KR)

(72) Inventors: Hyun Wook Lee, Yongin-si (KR); Sung Jin Lee, Yongin-si (KR); Jong Chan Lee, Yongin-si (KR); Tae Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 761 days.

(21) Appl. No.: 17/153,694

(22) Filed: Jan. 20, 2021

(65) Prior Publication Data

US 2021/0242381 A1     Aug. 5, 2021

(30) Foreign Application Priority Data

Jan. 30, 2020   (KR) .................. 10-2020-0011177
Nov. 19, 2020   (KR) .................. 10-2020-0155637

(51) Int. Cl.
*H10H 20/857*    (2025.01)
*H01L 23/00*    (2006.01)
(Continued)

(52) U.S. Cl.
CPC ........... *H10H 20/857* (2025.01); *H01L 24/32* (2013.01); *H01L 25/0753* (2013.01);
(Continued)

(58) Field of Classification Search
CPC ...... H10K 59/122; H10K 59/70; H10K 59/00; H10K 59/179; H10K 59/123;
(Continued)

(56) References Cited

U.S. PATENT DOCUMENTS

| 10,490,537 B2 | 11/2019 | Bae et al. |
| 2018/0175106 A1* | 6/2018 | Kim ................. H01L 33/60 |
| 2019/0115513 A1 | 4/2019 | Im et al. |
| 2019/0172760 A1* | 6/2019 | Hsiang ............ H01L 25/0753 |

(Continued)

FOREIGN PATENT DOCUMENTS

| KR | 10-2018-0072909 A | 7/2018 |
| KR | 10-2019-0042130 A | 4/2019 |

(Continued)

OTHER PUBLICATIONS

Notice of Allowance dated Aug. 7, 2025 for corresponding Korean Patent Application No. 10-2020-0155637 (7 pages).

*Primary Examiner* — Latanya N Crawford Eason
(74) *Attorney, Agent, or Firm* — Womble Bond Dickinson (US) LLP

(57) ABSTRACT

A display device includes a substrate; a first electrode and a second electrode on the substrate and spaced from each other at a first distance along a first direction; a third electrode and a fourth electrode on the first electrode and the second electrode, respectively, and spaced from each other at a second distance along the first direction; a first insulating layer on the third electrode and the fourth electrode; and a light emitting element located on the first insulating layer and between the third electrode and the fourth electrode in a plan view, and the second distance is greater than the first distance.

19 Claims, 22 Drawing Sheets

(51) Int. Cl.
*H01L 25/075* (2006.01)
*H01L 25/16* (2023.01)
*H10H 20/01* (2025.01)

(52) U.S. Cl.
CPC .. *H01L 25/167* (2013.01); *H01L 2224/32145* (2013.01); *H01L 2224/32225* (2013.01); *H10H 20/0364* (2025.01)

(58) Field of Classification Search
CPC . H10K 59/131; H01L 25/0753; H01L 27/156; H01L 25/167; H01L 33/62; H01L 24/32; H01L 2933/0066; H01L 2224/32145; H01L 2224/32225; H10H 20/857; H10H 29/49; H10H 29/922; H10H 29/942; H10H 20/0364; H10H 20/01
See application file for complete search history.

(56) References Cited

U.S. PATENT DOCUMENTS

| | | | |
|---|---|---|---|
| 2020/0020672 A1* | 1/2020 | Xi | H01L 27/1214 |
| 2020/0219779 A1* | 7/2020 | Yen | H01L 25/0753 |
| 2021/0111323 A1 | 4/2021 | Kim et al. | |
| 2021/0134768 A1 | 5/2021 | Lee et al. | |
| 2021/0305222 A1 | 9/2021 | Min et al. | |
| 2022/0093828 A1* | 3/2022 | Kwag | H01L 25/0753 |

FOREIGN PATENT DOCUMENTS

| | | |
|---|---|---|
| KR | 10-2019-0067296 A | 6/2019 |
| KR | 10-2020-0004936 A | 1/2020 |
| KR | 10-2020-0006209 A | 1/2020 |
| KR | 10-2020-0006650 A | 1/2020 |
| KR | 10-2021-0044938 A | 4/2021 |
| KR | 10-2021-0053391 A | 5/2021 |

* cited by examiner

DISPLAY DEVICE AND METHOD OF MANUFACTURING THE SAME

CROSS-REFERENCE TO RELATED APPLICATIONS

This application claims priority to and the benefit of Korean Patent Application No. 10-2020-0011177, filed on Jan. 30, 2020 and Korean Patent Application No. 10-2020-0155637, filed on Nov. 19, 2020, the entire contents of all of which are hereby incorporated by reference for all purposes as if fully set forth herein.

BACKGROUND

1. Field

The present disclosure relates to a display device and a method of manufacturing the same.

2. Description of the Related Art

Recently, as interest in information displays increases, research and development of display devices has been continuously conducted.

SUMMARY

An aspect of the present disclosure is to provide a display device in which reliability can be improved by arranging a light emitting element in an accurate position and a method of manufacturing the same.

Another aspect of the present disclosure is to provide a display device in which reliability of an electrical signal can be improved.

The aspects of the present disclosure are not limited to the aspects mentioned above, and other aspects not mentioned will be clearly understood by those skilled in the art from the following description.

According to some embodiments of the present disclosure, a display device includes a substrate, a first electrode and a second electrode on the substrate and spaced from each other at a first distance along a first direction, a third electrode and a fourth electrode on the first electrode and the second electrode, respectively, and spaced from each other at a second distance along the first direction, and a light emitting element located between the third electrode and the fourth electrode in a plan view. The second distance may be greater than the first distance.

In some embodiments, the display device includes a length of the light emitting element in the first direction may be greater than the first distance and less than the second distance, and at least a portion of the first electrode and at least a portion of the second electrode may overlap the light emitting element.

In some embodiments, the first electrode and the second electrode may include the same material, and the third electrode and the fourth electrode may include a material different from the first electrode and the second electrode.

In some embodiments, the first electrode and the second electrode may include at least one of indium tin oxide (ITO), indium zinc oxide (IZO), zinc oxide (ZnO), and indium tin zinc oxide (ITZO).

In some embodiments, the third electrode and the fourth electrode may include at least one of Ag, Mg, Al, Pt, Pd, Au, Ni, Nd, Ir, Cr, Li, Ca, LiF/Ca, LiF/Al, Mo, Ti, and Cu.

In some embodiments, the third electrode may contact the first electrode, and the fourth electrode may contact the second electrode.

In some embodiments, the display device further includes a first insulating layer on the third electrode and the fourth electrode. The light emitting element may be on the first insulating layer.

In some embodiments, the display device further includes a first insulating pattern and a second insulating pattern on the first insulating layer and spaced from each other along the first direction. The light emitting element may be between the first insulating pattern and the second insulating pattern.

In some embodiments, the display device further includes a fifth electrode contacting the first electrode and a first end of the light emitting element and a sixth electrode contacting the second electrode and a second end of the light emitting element.

In some embodiments, the fifth electrode and the sixth electrode may be on the first insulating layer, the first insulating layer and the third electrode may include a first opening exposing at least a portion of the first electrode, the first insulating layer and the fourth electrode may include a second opening exposing at least a portion of the second electrode, the fifth electrode may be connected to the first electrode through the first opening, and the sixth electrode may be connected to the second electrode through the second opening.

In some embodiments, the display device further includes a anchoring layer on the light emitting element. The anchoring layer may contact at least a portion of an outer peripheral surface of the light emitting element, and expose the first end and the second end of the light emitting element.

In some embodiments, the display device further includes a first bank between the first electrode and the substrate and overlapping the first electrode and the third electrode, and a second bank between the second electrode and the substrate and overlapping the second electrode and the fourth electrode.

In some embodiments, the display device further includes a first bank and a second bank on the first insulating layer and each having a shape protruding in a display direction of the light emitting element. The first opening may be positioned between the first bank and the light emitting element, and the second opening may be positioned between the second bank and the light emitting element.

According to another embodiment of the present disclosure, a method of manufacturing a display device includes sequentially forming a first conductive layer and a second conductive layer on a substrate; etching the first conductive layer to form a first electrode and a second electrode spaced from each other at a first distance along a first direction, and etching the second conductive layer to form a third electrode and a fourth electrode spaced from each other at a second distance along the first direction; forming an insulating layer on the third electrode and the fourth electrode; and aligning a light emitting element on the insulating layer. The second distance may be greater than the first distance, and the light emitting element may be aligned between the third electrode and the fourth electrode in a plan view.

In some embodiments, a length of the light emitting element in the first direction may be greater than the first distance and less than the second distance, and at least a portion of the first electrode and at least a portion of the second electrode may overlap the light emitting element.

In some embodiments, forming the first to fourth electrodes includes etching the first conductive layer and the second conductive layer; crystallizing the first electrode and the second electrode by performing a bake process for heating the substrate; and forming the third electrode and the fourth electrode by additionally etching an etched second conductive layer.

The method further includes forming a first opening in the third electrode and the insulating layer; and forming a second opening in the fourth electrode and the insulating layer.

The method further includes forming a fifth electrode and a sixth electrode on the insulating layer. The forming the fifth electrode and the sixth electrode may include contacting the fifth electrode with the first electrode through the first opening; and contacting the sixth electrode with the second electrode through the second opening. The method further includes forming a first bank and a second bank each having a shape protruding in a display direction of the light emitting element on the insulating layer. The first opening may be positioned between the first bank and the light emitting element, and the second opening may be positioned between the second bank and the light emitting element.

In some embodiments, the forming the insulating layer further includes forming a first insulating pattern and a second insulating pattern spaced from each other along the first direction on the insulating layer. The light emitting element may be between the first insulating pattern and the second insulating pattern.

According to still another embodiment, a display device includes a substrate; a first electrode and a second electrode on the substrate; a third electrode on the first electrode and having a first opening exposing at least a portion of the first electrode; a fourth electrode on the second electrode and having a second opening exposing at least a portion of the second electrode; a light emitting element located between the third electrode and the fourth electrode when viewed on a plan and capable of emitting light in a display direction; a fifth electrode having at least a portion electrically connected to one end of the light emitting element, and the fifth electrode being on the third electrode; and a sixth electrode having at least a portion electrically connected to the other end of the light emitting element, and the sixth electrode being on the fourth electrode. The fifth electrode may be connected to the first electrode through the first opening, and the sixth electrode may be connected to the second electrode through the second opening.

In some embodiments, the first electrode and the fifth electrode include a first material, and the second electrode and the sixth electrode include a second material.

In some embodiments, the first material and the second material include at least one of indium tin oxide (ITO), indium zinc oxide (IZO), zinc oxide (ZnO), and indium tin zinc oxide (ITZO).

The display device further includes an emission region through which light can be emitted; a non-emission region that is a region other than the emission region; and a partition wall having a shape protruding in the display direction and defining the emission region. The first opening and the second opening may be in the non-emission region.

The display device includes the first opening and the second opening overlap the partition wall.

In some embodiments, the non-emission region includes a region in which at least a portion of the first electrode or the second electrode is cut.

The display device further includes a bank arranged in the emission region and having a shape protruding in the display direction. At least a portion of each of the first electrode and the second electrode may be positioned on the bank, and the first opening and the second opening may not overlap the bank.

The means for solving the problem of the present disclosure is not limited to the above-described solutions. Solutions that are not mentioned will be clearly understood by those of ordinary skill in the art from the present disclosure and the accompanying drawings.

BRIEF DESCRIPTION OF THE DRAWINGS

The accompanying drawings, which are included to provide a further understanding of the inventive concepts, and are incorporated in and constitute a part of this specification, illustrate example embodiments of the inventive concepts, and, together with the description, serve to explain principles of the inventive concepts.

DETAILED DESCRIPTION

Figure 1:
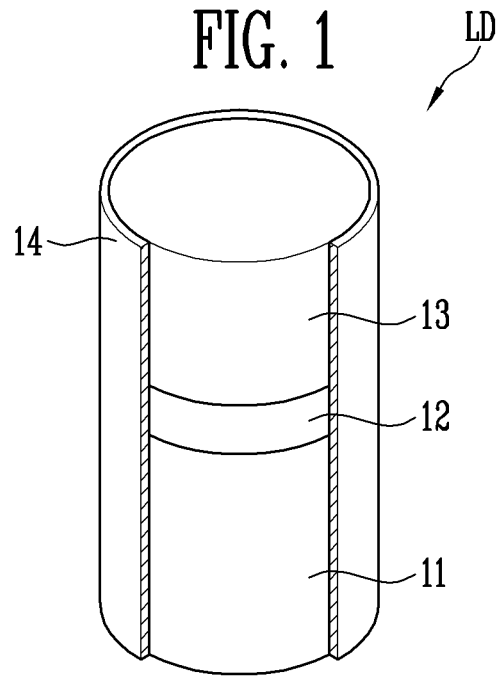
FIGS. 1 and 2 are perspective cutaway views of light emitting elements according to one or more embodiments of the present disclosure.

Aspects and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete the disclosure of the present disclosure and to fully inform a person having ordinary skill in the art to which the present disclosure pertains the scope of the present disclosure. The present disclosure is only defined by the scope of the appended claims.

A phrase "an element or a layer is located on another element or another layer" may refer to that the element may be located directly on another element and/or the element may be located indirectly on another element via another element or another layer. Like reference numerals generally refer to like elements throughout the present disclosure. Shapes, sizes, ratios, angles, numbers, and the like disclosed in the drawings for describing the embodiments are examples, and thus, the present disclosure is not limited thereto.

Although the terms first, second, etc. may be used herein to describe various components, these components should not be limited by these terms. These terms are only used to distinguish one component from another component. Thus, a first component discussed below may be a second component within the technical spirit of the present disclosure. Singular expressions may include plural expressions unless the context clearly indicates otherwise.

Features of each of the example embodiments of the present disclosure can be coupled or combined with each other, partly or wholly, and can be variously interlocked and driven in a technical manner. Each of the example embodiments may be implemented independently of each other, or may be implemented together in an association.

Throughout the disclosure, like reference numerals refer to like parts throughout the various figures and embodiments of the present disclosure.

Spatially relative terms, such as "beneath," "below," "lower," "under," "above," "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. As used herein, the term "and/or" includes any and all combinations of one or more of the associated listed items. As used herein, expressions such as "at least one of," "one of," and "selected from," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on," "connected to," "coupled to," or "adjacent to" another element or layer, it may be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present.

Hereinafter, one or more embodiments of the present disclosure will be described in detail with reference to the accompanying drawings.

The present disclosure relates to a display device and a method of manufacturing the same.

Figure 2:
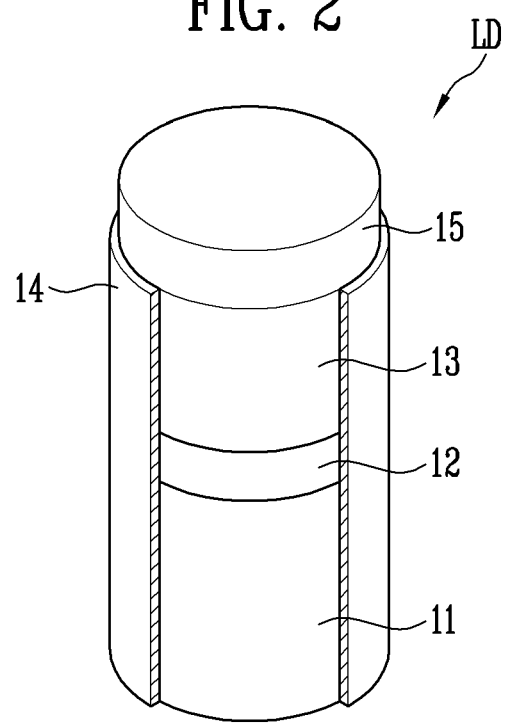

FIGS. 1 and 2 are perspective cutaway views of light emitting elements according to one or more embodiments of the present disclosure.

Referring to FIGS. 1 and 2, a light emitting element LD may include a first semiconductor layer 11, a second semiconductor layer 13, and an active layer 12 interposed between the first and second semiconductor layers 11 and 13. For example, the light emitting element LD may be implemented as a stacked structure in which the first semiconductor layer 11, the active layer 12, and the second semiconductor layer 13 are sequentially stacked.

The light emitting element LD may be provided in a rod shape extending along one direction. When the extending direction of the light emitting element LD is a longitudinal direction, the light emitting element LD may have one end and the other end along the longitudinal direction.

One of the first and second semiconductor layers 11 and 13 may be located adjacent to one end of the light emitting element LD, and the other one of the first and second semiconductor layers 11 and 13 may be located adjacent to the other end of the light emitting element LD.

In one or more embodiments of the present disclosure, the light emitting element LD may be provided in the rod shape. Here, the term "rod shape" may include a rod-like shape or a bar-like shape that is long in the longitudinal direction (e.g., having an aspect ratio greater than 1), such as a cylinder or a polygonal column. For example, a length of the light emitting element LD may be greater than a diameter thereof. However, the present disclosure is not limited thereto. Further, the light emitting element LD may be a light emitting element having a core-shell structure.

For example, the light emitting element LD may be manufactured to have the diameter and/or the length of micro-scale or nano-scale. For example, the diameter of the light emitting element LD may be about 600 nm or less, and the length of the light emitting element LD may be about 4 µm or less. However, the size of the light emitting element LD is not limited thereto, and the size of the light emitting element LD may be changed to meet the requirements of a display device to which the light emitting element LD is applied.

The first semiconductor layer 11 may include, for example, at least one n-type semiconductor layer. For example, the first semiconductor layer 11 may include any one semiconductor material selected from the group consisting of InAlGaN, GaN, AlGaN, InGaN, AlN, and InN. In another embodiment, the first semiconductor layer 11 may include a semiconductor layer doped with a first dopant such as Si, Ge, Sn, or the like. However, the material constituting the first semiconductor layer 11 is not limited thereto.

The active layer 12 may be formed on the first semiconductor layer 11 and may be formed in a single or multiple quantum well structure. In one or more embodiments, when the active layer 12 includes a material having the multiple quantum well structure, a plurality of quantum layers and a plurality of well layers may be alternately stacked.

In one or more embodiments, when an electric field exceeding a voltage (e.g., a set or predetermined voltage) is applied between both ends of the light emitting element LD, the light emitting element LD may emit light while electron-hole pairs are combined in the active layer 12. When the light emission of the light emitting element LD is controlled using this principle, the light emitting element LD may be used as a light source of various light emitting devices including a pixel of the display device.

The active layer 12 may emit light having a wavelength of about 400 nm to about 900 nm. For example, when the active layer 12 emits light having a blue wavelength band, a material such as AlGaN or AlGaInN may be included. For example, when the active layer 12 has the multiple quantum well structure in which the quantum layers and the well layers are alternately stacked, the quantum layers may include a material such as AlGaN or AlGaInN, and the well layers may include a material such as GaN or AlInN. In one or more example embodiments, the active layer 12 may include AlGaInN as the quantum layers, and AlInN as the well layers. In such a case, the active layer 12 may emit blue light having a center wavelength band in a range of about 450 nm to about 495 nm.

However, the present disclosure is not limited thereto. The active layer 12 may have a structure in which semiconductor materials having a large bandgap energy and semiconductor materials having a small bandgap energy are alternately stacked, and may include other semiconductor materials of Groups III-V according to a wavelength range of emitted light. The light emitted from the active layer 12 is not limited to the light in the blue wavelength band, and may be light in red and green wavelength bands in some cases.

On the other hand, in one or more embodiments, the light emitted from the active layer 12 may be emitted from both sides as well as an outer surface of the light emitting element LD in the longitudinal direction. Direction of the light emitted from the active layer 12 is not limited to one direction.

The second semiconductor layer 13 may be provided on the active layer 12 and may include a semiconductor layer of a different type from the first semiconductor layer 11. The second semiconductor layer 13 may include, for example, at least one p-type semiconductor layer. For example, the second semiconductor layer 13 may include at least one semiconductor material selected from the group consisting of InAlGaN, GaN, AlGaN, InGaN, AlN, and InN. In another embodiment, the second semiconductor layer 13 may include a semiconductor layer doped with a second dopant such as Mg, Zn, Ca, Se, Ba, or the like. The material constituting the second semiconductor layer 13 is not limited thereto.

In one or more embodiments, in FIGS. 1 and 2, the first semiconductor layer 11 and the second semiconductor layer 13 are shown as one layer, respectively. However, the present disclosure is not limited thereto. For example, the first semiconductor layer 11 and the second semiconductor layer 13 may include a larger number of layers depending on the material of the active layer 12. For example, the first semiconductor layer 11 and the second semiconductor layer 13 may further include a clad layer or a tensile strain barrier reducing (TSBR) layer.

According to one or more embodiments of the present disclosure, the light emitting element LD may further include other phosphor layers, active layers, semiconductor layers, and/or electrode layers located above and/or below each of the first semiconductor layer 11, the active layer 12, and the second semiconductor layer 13 described above.

In one or more embodiments, the light emitting element LD may further include at least one electrode layer located on one end (for example, an upper surface of the light emitting element LD) of the second semiconductor layer 13 or one end (for example, a lower surface of the light emitting element LD) of the first semiconductor layer 11. For example, the light emitting element LD may further include an electrode layer 15 located on one end of the second semiconductor layer 13, as shown in FIG. 2.

In one or more embodiments, the electrode layer 15 may be located on one end of the first semiconductor layer 11. The electrode layer 15 may be an ohmic electrode, but the present disclosure is not limited thereto. For example, the electrode layer 15 may be a Schottky contact electrode. The electrode layer 15 may include metal or metal oxide. For example, the electrode layer 15 may include chromium (Cr), titanium (Ti), aluminum (Al), gold (Au), nickel (Ni), indium tin oxide (ITO), indium zinc oxide (IZO), and indium tin-zinc oxide (ITZO), or oxides, alloys, or mixtures thereof. However, the present disclosure is not limited thereto. In another embodiment, the electrode layer 15 may be substantially transparent or translucent. Accordingly, the light generated in the light emitting element LD may pass through the electrode layer 15 and may be emitted to outside of the light emitting element LD.

In one or more embodiments, the light emitting element LD may further include an insulating thin film 14. However, according to one or more embodiments of the present disclosure, the insulating thin film 14 may be omitted, and may be provided to cover only a portion of the first semiconductor layer 11, the active layer 12, and the second semiconductor layer 13. For example, the insulating thin film 14 may be provided at portions excluding both ends of the light emitting element LD, so that both ends of the light emitting element LD may be exposed.

For convenience of description, FIGS. 1 and 2 show a state in which a portion of the insulating thin film 14 is removed, but substantially side surfaces of the light emitting element LD may be surrounded by the insulating thin film 14. According to one or more embodiments, the insulating thin film 14 may include a transparent insulating material. For example, the insulating thin film 14 may include at least one insulating material of silicon oxide (SiOx), silicon nitride (SiNx), silicon oxynitride (SiOxNy), aluminum oxide (AlOx), or titanium oxide (TiOx). However, the present disclosure is not limited thereto, and the insulating thin film 14 may include various other materials having insulating properties.

The insulating thin film 14 may prevent an electrical short circuit (or may provide protection from the electrical short circuit) that may occur when the active layer 12 contacts conductive materials other than the first semiconductor layer 11 and the second semiconductor layer 13. In one or more embodiments, by forming the insulating thin film 14, surface defects of the light emitting element LD are reduced or minimized, so that life and efficiency may be improved. In one or more embodiments, when a plurality of light emitting elements LD are located adjacent to each other, an unwanted short circuit that may occur between the light emitting elements LD may be prevented by the insulating thin film 14. For example, the insulating thin film 14 may provide protection from an unwanted short circuit between adjacent light emitting elements LD.

The type, structure, and shape of the light emitting element LD according to the embodiments of the present disclosure may be variously changed.

Figure 3:
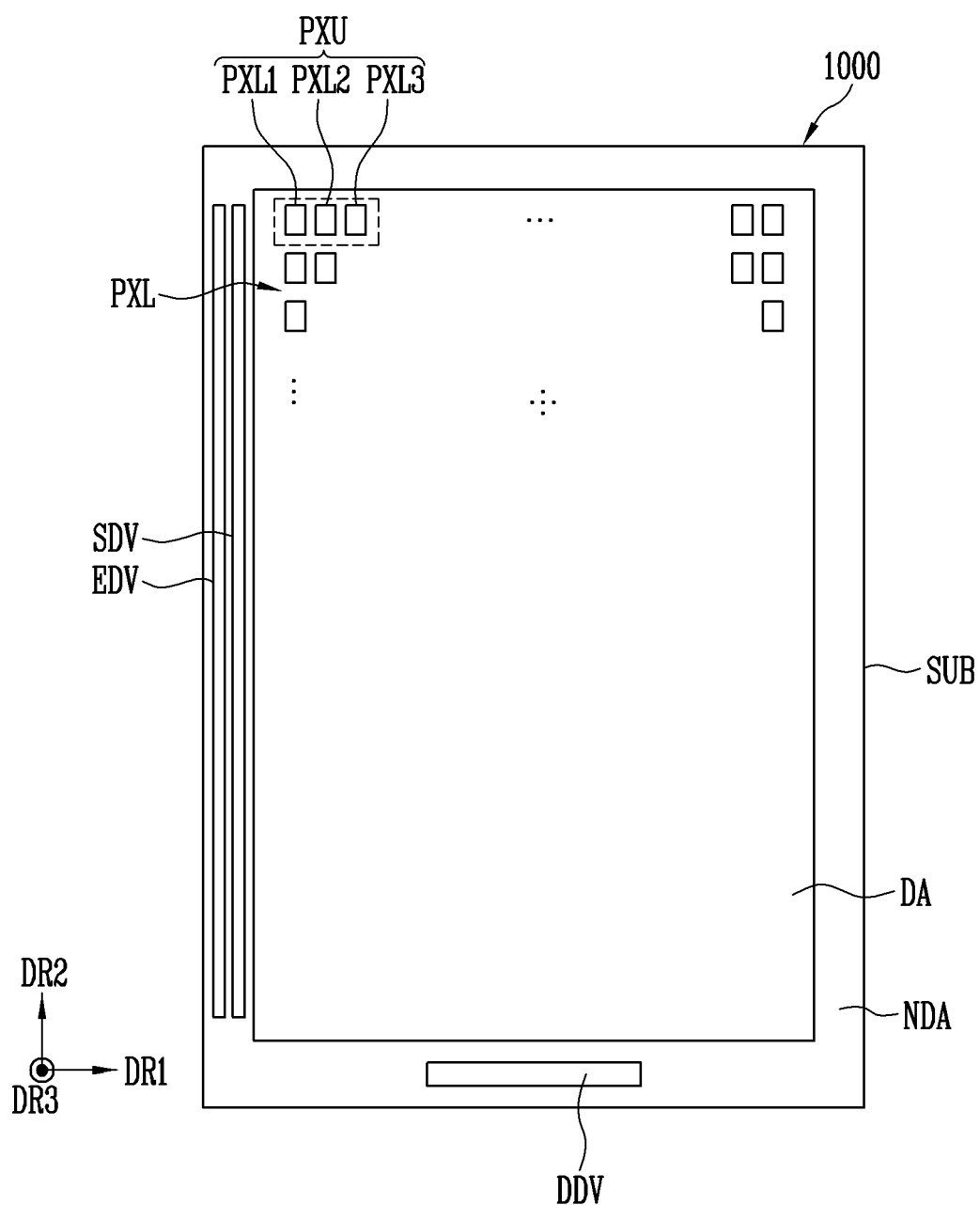
FIG. 3 is a plan view illustrating a display device according to one or more embodiments of the present disclosure.

FIG. 3 is a plan view illustrating a display device according to one or more embodiments of the present disclosure.

Referring to FIGS. 1, 2 and 3, a display device 1000 may include a substrate SUB and a plurality of pixels PXL provided on the substrate SUB. The display device 1000 (or the substrate SUB) may include a display region DA in which the plurality of pixels PXL are arranged to display an image, and a non-display region NDA excluding the display region DA.

The display region DA may be a region in which the pixels PXL are provided. The non-display region NDA may be a region in which driving units, for example, a scan driving voltage unit or a scan driver (SDV), a data driving voltage unit or a data driver (DDV), and an emission driving voltage unit or an emission control driver (EDV) for driving the pixels PXL are provided, and in which various wirings for connecting the pixels PXL and the driving units are provided.

The display region DA may have various shapes. For example, the display region DA may have various shapes such as a closed polygon including straight sides, a circle or ellipse including curved sides, and a semicircle or semi-ellipse including straight and curved sides.

In one or more embodiments, when the display region DA includes a plurality of regions, each region may also have various shapes such as the closed polygon including straight sides, the semicircle or semi-ellipse including curved sides, and the like. In one or more embodiments, areas of the plurality of regions may be the same or different. In one or more embodiments of the present disclosure, a case where the display region DA is provided as one region having a square shape including straight sides will be described as an example.

The non-display region NDA may be provided on at least one side of the display region DA. In one or more embodiments of the present disclosure, the non-display region NDA may surround the display region DA.

The pixels PXL may be provided in the display region DA on the substrate SUB. Each of the pixels PXL may include at least one light emitting element LD connected to a scan line and a data line and driven by corresponding scan signal and data signal.

Each of the pixels PXL may emit light of any one of red, green, and blue colors, but the present disclosure is not limited thereto. For example, each of the pixels PXL may emit light of one of cyan, magenta, yellow, and white colors.

In one or more embodiments, the pixels PXL may include a first pixel PXL1 (or a first sub-pixel) that emits light of a first color, a second pixel PXL2 (or a second sub-pixel) that emits light of a second color different from the first color, and a third pixel PXL3 (or a third sub-pixel) that emits light of a third color different from the first color and the second color. At least one first pixel PXL1, second pixel PXL2, and third pixel PXL3 located adjacent to each other may constitute one pixel unit PXU capable of emitting light of various colors.

In one or more embodiments, the first pixel PXL1 may be a red pixel that emits red light, the second pixel PXL2 may be a green pixel that emits green light, and the third pixel PXL3 may be a blue pixel that emits blue light.

In one or more embodiments, the pixels PXL may have light emitting elements that emit light of the same color. However, in one or more embodiments, when the pixels PXL include light conversion layers of different colors located on the light emitting elements, the pixels PXL may emit light of different colors. In another embodiment, the pixels PXL may include light emitting elements that emit light of different colors. However, the color, type, and/or number of the pixels PXL are not particularly limited.

The plurality of pixels PXL may be provided and arranged along a first direction DR1 and a second direction DR2 crossing the first direction DR1. However, the arrangement form of the pixels PXL is not particularly limited, and may be arranged in various forms.

The driving units SDV, DDV, and EDV may provide signals to each pixel PXL through each wiring unit, and thus driving of each pixel PXL may be controlled. In FIG. 3, the wiring unit is omitted for convenience of description.

The driving units SDV, DDV, and EDV may include a scan driver SDV providing scan signals to the pixels PXL through scan lines, a data driver DDV providing data signals to the pixels PXL through data lines, an emission control driver EDV providing emission control signals to the pixels PXL through emission control lines, and a timing controller. The timing controller may control the scan driver SDV, the data driver DDV, and the emission control driver EDV. In one or more embodiments, the emission control driver EDV may be omitted, however, the present disclosure is not limited thereto.

The scan driver SDV may be located on one side of the substrate SUB, and may be arranged along one direction (for example, the second direction DR2). The scan driver SDV may be mounted on the substrate SUB as a separate component, but the present disclosure is not limited thereto. For example, the scan driver SDV may be directly formed on the substrate SUB. In one or more embodiments, the scan driver SDV may be positioned outside the substrate SUB and may be connected to the pixels PXL through separate connection members.

The data driver DDV may be located on one side of the substrate SUB, and may be arranged along a direction (for example, the first direction DR1) crossing the scan driver SDV described above. The data driver DDV may be mounted on the substrate SUB as a separate component, or may be positioned outside the substrate SUB and may be connected to the pixels PXL through separate connection members.

The emission control driver EDV may be located on one side of the substrate SUB, and may be arranged along one direction (for example, the second direction DR2). As shown in FIG. 3, the emission control driver EDV may be located at the same side of the substrate SUB, and at the same side of the display area DA as the scan driver SDV, but the present disclosure is not limited thereto. For example, the emission control driver EDV may be located on a different side from the scan driver SDV (e.g., with the display area DA therebetween). The emission control driver EDV may be mounted on the substrate SUB as a separate component, but the present disclosure is not limited thereto. For example, the emission control driver EDV may be directly formed on the substrate SUB. In one or more embodiments, the emission control driver EDV may be positioned outside the substrate SUB and may be connected to the pixels PXL through separate connection members.

In one or more embodiments, each of the pixels PXL may be configured as an active pixel. However, the type, structure, and/or driving method of the pixels PXL that can be applied to the present disclosure are not particularly limited.

Figure 4:
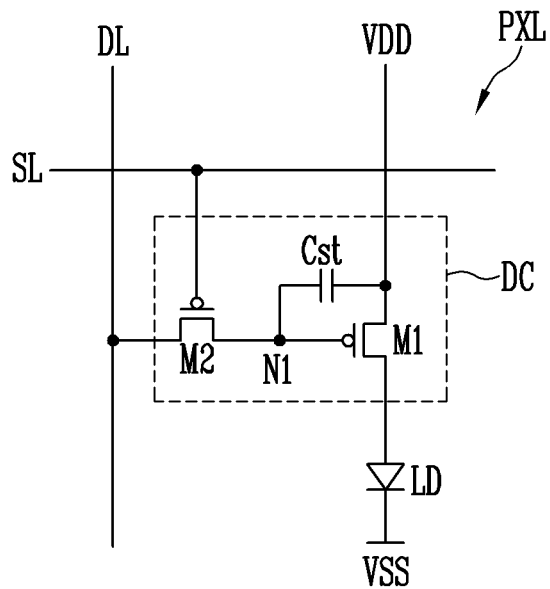
FIGS. 4-6 are circuit diagrams illustrating pixels according to one or more embodiments of the present disclosure.
Figure 5:
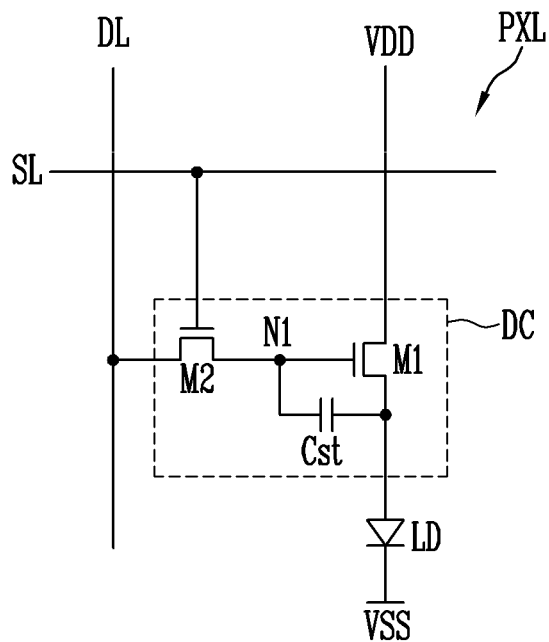
Figure 6:
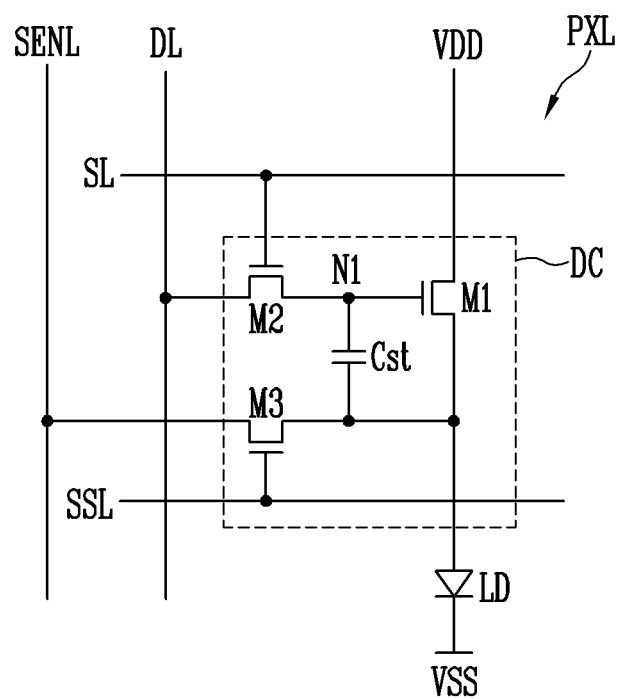

FIGS. 4-6 are circuit diagrams illustrating pixels according to one or more embodiments of the present disclosure. In one or more embodiments, FIGS. 4-6 show examples of pixels constituting an active light emitting display panel.

Referring to FIGS. 1, 2, 3, and 4, a pixel PXL may include at least one light emitting element LD and a driving circuit DC connected to the light emitting element LD to drive the light emitting element LD.

Figure 8:
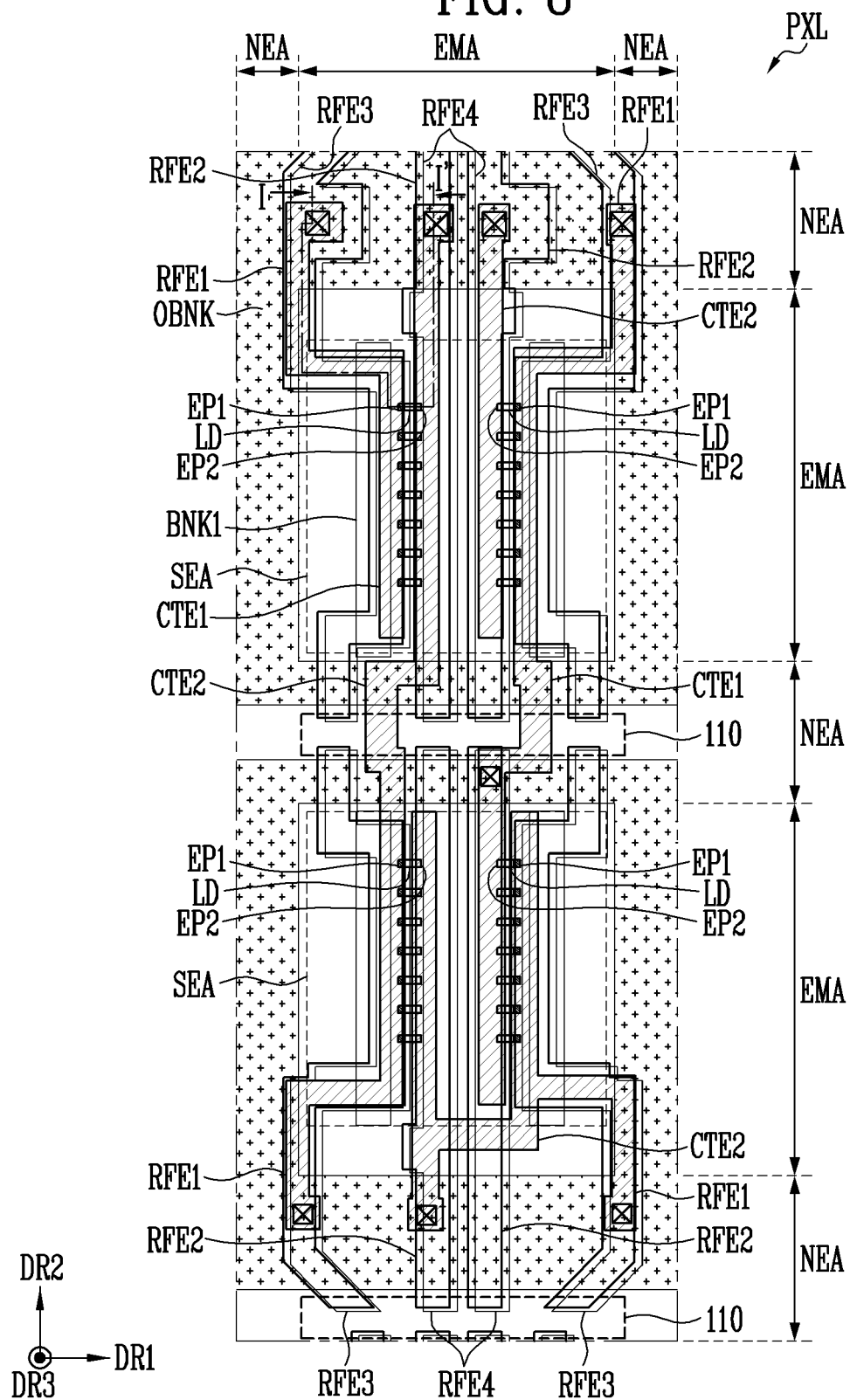
FIG. 8 is a plan view schematically illustrating a pixel according to one or more embodiments of the present disclosure.

A first electrode (e.g., 'RFE1' shown in FIG. 8) of the light emitting element LD may be connected to a first driving power source VDD via the driving circuit DC, and may be connected to a second driving power source VSS via a second electrode (e.g., 'RFE2' shown in FIG. 8). According to an example, the first electrode RFE1 may be an anode electrode, and the second electrode RFE2 may be a cathode electrode, but the present disclosure is not limited thereto. The light emitting element LD may emit light with a luminance corresponding to the amount of driving current controlled by the driving circuit DC.

At least one of first to fourth electrodes RFE1 to RFE4 may be a pixel electrode of the pixel PXL. After at least one of the first to fourth electrodes RFE1 to RFE4 is formed as an alignment line, a portion of at least one of the first to fourth electrodes RFE1 to RFE4 may be cut off between adjacent pixels PXL and/or emission regions of each pixel PXL (refer to 'EMA' shown in FIG. 8) to be separated into respective pixel electrodes. In this case, an emission region EMA may refer to a region in which light is emitted from the pixel PXL. According to an example, the emission region EMA may be defined by a partition wall (e.g., 'OBNK' shown in FIG. 8).

FIG. 4 shows only one light emitting element LD, however, the present disclosure is not limited thereto. For example, the pixel PXL may include a plurality of light emitting elements LD. The plurality of light emitting elements LD may be connected to each other in parallel and/or in series.

The first driving power source VDD and the second driving power source VSS may have different potentials. For example, the first driving power source VDD may have a potential as high as a threshold voltage of the light emitting element LD in a potential of the second driving power source VSS. For example, a voltage applied from the first driving power source VDD may be greater than a voltage applied from the second driving power source VSS.

According to one or more embodiments, the driving circuit DC may include a first transistor M1, a second transistor M2, and a storage capacitor Cst.

One electrode of the first transistor M1 (e.g., a driving transistor) may be electrically connected to the first driving power source VDD, and the other electrode of the first transistor M1 may be electrically connected to the first electrode RFE1 of the light emitting element LD. A gate electrode of the first transistor M1 may be connected to a first node N1. The first transistor M1 may control the amount of driving current supplied to the light emitting elements LD in response to a voltage of the first node N1.

One electrode of the second transistor M2 (e.g., a switching transistor) may be connected to a data line DL, and the other electrode of the second transistor M2 may be connected to the first node N1. Here, one electrode and the other electrode of the second transistor M2 may be different electrodes. For example, when the one electrode of the second transistor M2 is a source electrode, the other electrode of the second transistor M2 may be a drain electrode. A gate electrode of the second transistor M2 may be connected to a scan line SL.

The second transistor M2 may be turned on when a scan signal of a voltage (for example, a gate-on voltage) at which the first transistor M1 can be turned on is supplied from the scan line SL to electrically connect the data line DL and the first node N1. In such a case, a data signal of corresponding frame may be supplied to the data line DL, and accordingly, the data signal may be transferred to the first node N1. The data signal transferred to the first node N1 may be stored in the storage capacitor Cst.

One electrode of the storage capacitor Cst may be connected to the first driving power source VDD, and the other electrode of the storage capacitor Cst may be connected to the first node N1. The storage capacitor Cst may be charged with a voltage corresponding to the data signal supplied to the first node N1, and may maintain the charged voltage until the data signal of the next frame is supplied.

For convenience of description, FIG. 4 shows the driving circuit DC having a relatively simple structure including the second transistor M2 for transferring the data signal to the interior of the pixel PXL, the storage capacitor Cst for storing the data signal, and the first transistor M1 for supplying the driving current corresponding to the data signal to the light emitting element LD.

However, the present disclosure is not limited thereto, and the structure of the driving circuit DC may be variously changed. For example, the driving circuit DC may further include various transistors, such as a compensation transistor for compensating a threshold voltage of the first transistor M1, an initialization transistor for initializing the first node N1, and/or an emission control transistor for controlling an emission time of the light emitting element LD, and other circuit elements such as a boosting capacitor for boosting the voltage of the first node N1.

In FIG. 4, transistors included in the driving circuit DC, for example, the first and second transistors M1 and M2 are shown as P-type transistors, but the present disclosure is not limited thereto. For example, at least one of the first and second transistors M1 and M2 included in the driving circuit DC may be changed to an N-type transistor.

For example, as shown in FIG. 5, the first and second transistors M1 and M2 of the driving circuit DC may be implemented as N-type transistors. The driving circuit DC shown in FIG. 5 may be similar in structure or operation to the driving circuit DC of FIG. 4, except that positions in which some components are connected are changed due to a change in the type of transistors. Therefore, detailed descriptions of the same or similar components thereof may not be repeated.

As another embodiment, referring to FIG. 6, the pixel PXL may further include a third transistor M3 (e.g., a sensing transistor).

A gate electrode of the third transistor M3 may be connected to a sensing signal line SSL. One electrode of the third transistor M3 may be connected to a sensing line SENL, and the other electrode of the third transistor M3 may be connected to the anode electrode of the light emitting element LD. The third transistor M3 may transfer a voltage value of the anode electrode of the light emitting element LD to the sensing line SENL according to a sensing signal supplied to the sensing signal line SSL during a sensing period. The voltage value transferred through the sensing line SENL may be provided to an external circuit (for example, the timing controller). The external circuit may extract characteristic information (for example, the threshold voltage of the first transistor M1) of the pixel PXL based on the provided voltage value. The extracted characteristic information may be used to convert image data to compensate for characteristic deviation of the pixel PXL.

Figure 7:
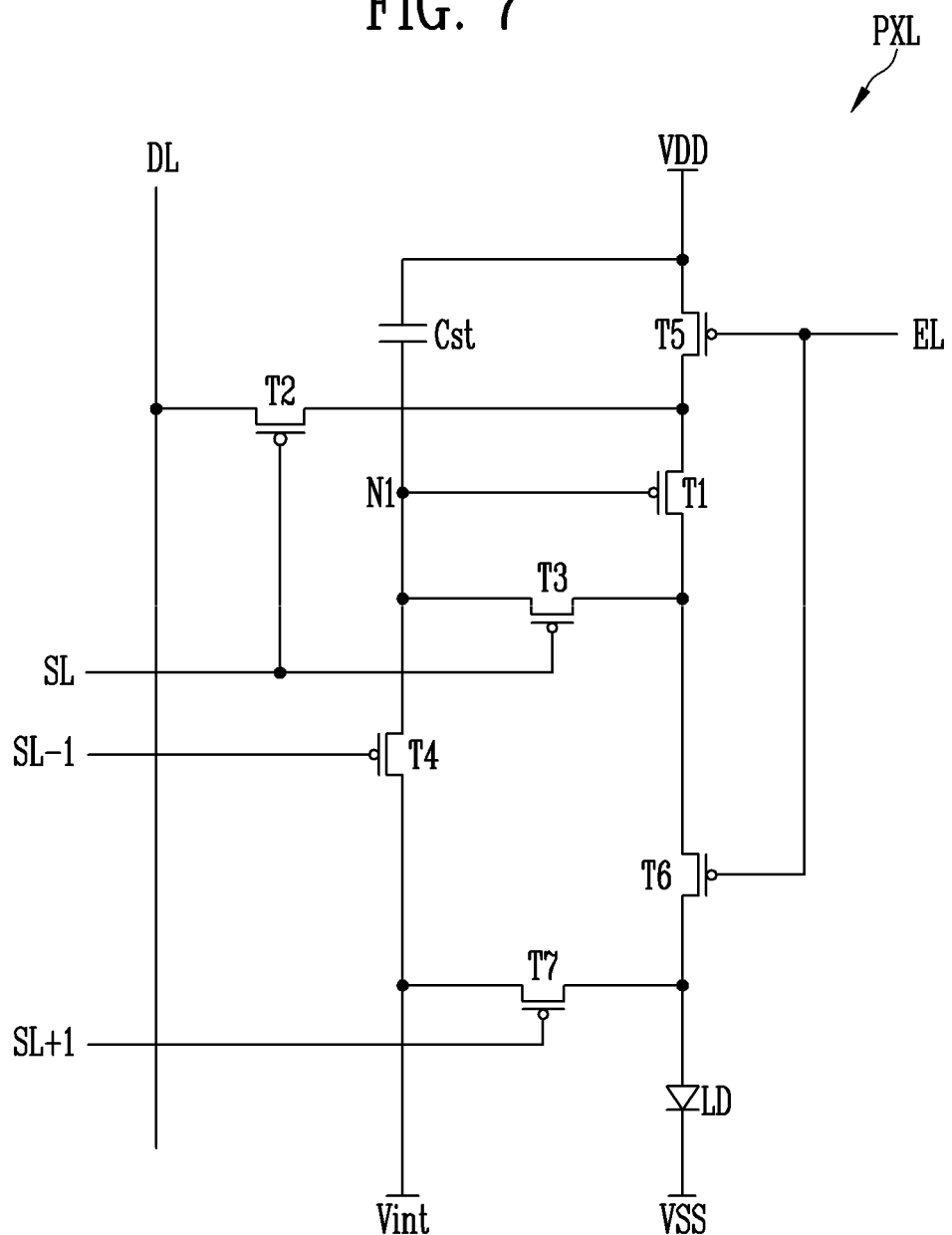
FIG. 7 is a circuit diagram illustrating a pixel according to another embodiment of the present disclosure.

FIG. 7 is a circuit diagram illustrating a pixel according to another embodiment of the present disclosure.

Referring to FIG. 7, a pixel PXL according to another embodiment of the present disclosure may include a light emitting element LD, first through seventh transistors T1, T2, T3, T4, T5, T6, and T7, and a storage capacitor Cst.

A first electrode RFE1 (for example, an anode electrode) of a light emitting element LD may be connected to a first transistor T1 via a sixth transistor T6, and a second electrode RFE2 (for example, a cathode electrode) of the light emitting element LD may be connected to a second driving power source VSS. The light emitting element LD may emit light with a luminance (e.g., set or predetermined luminance) corresponding to the amount of driving current supplied from the first transistor T1.

One electrode of the first transistor T1 (e.g., a driving transistor) may be connected to a first driving power source VDD via a fifth transistor T5, and the other electrode of the first transistor T1 may be connected to the first electrode of the light emitting element LD via the sixth transistor T6. The first transistor T1 may control the amount of current flowing from the first driving power source VDD to the second driving power source VSS via the light emitting element LD in response to a voltage of the first node N1 which is connected to a gate electrode of the first transistor T1.

A second transistor T2 (e.g., a switching transistor) may be connected between a data line DL and one electrode of the first transistor T1. In one or more embodiments, a gate electrode of the second transistor T2 may be connected to a first scan line SL. The second transistor T2 may be turned on when a scan signal of a gate-on voltage is supplied to the first scan line SL to electrically connect the data line DL and one electrode of the first transistor T1.

A third transistor T3 may be connected between the other electrode of the first transistor T1 and the first node N1. In one or more embodiments, a gate electrode of the third transistor T3 may be connected to the first scan line SL. The third transistor T3 may be turned on when the scan signal of the gate-on voltage is supplied to the first scan line SL to electrically connect the other electrode of the first transistor T1 and the first node N1.

A fourth transistor T4 may be connected between the first node N1 and an initialization power source Vint. In one or more embodiments, a gate electrode of the fourth transistor T4 may be connected to a second scan line SL−1. The fourth transistor T4 may be turned on when the scan signal of the gate-on voltage is supplied to the second scan line SL−1 to supply a voltage of the initialization power source Vint to the first node N1. Here, the initialization power source Vint may be set to a voltage lower than a data signal. The scan signal supplied to the second scan line SL−1 may have the same waveform as the scan signal supplied to the first scan line of the pixel of a previous stage.

The fifth transistor T5 may be connected between the first driving power source VDD and one electrode of the first transistor T1. A gate electrode of the fifth transistor T5 may be connected to an emission control line EL. The fifth transistor T5 may be turned on when an emission control signal of the gate-on voltage is supplied to the emission control line EL, and may be turned off when an emission control signal of the gate-on voltage is not supplied to the emission control line EL.

The sixth transistor T6 may be connected between the other electrode of the first transistor T1 and the first electrode RFE1 of the light emitting element LD. A gate electrode of the sixth transistor T6 may be connected to the emission control line EL. The sixth transistor T6 may be turned on when the emission control signal of the gate-on voltage is supplied to the emission control line EL, and may be turned off when an emission control signal of the gate-on voltage is supplied to the emission control line EL.

A seventh transistor T7 may be connected between the initialization power source Vint and the first electrode RFE1 of the light emitting element LD. In one or more embodiments, a gate electrode of the seventh transistor T7 may be connected to a third scan line SL+1. The seventh transistor T7 may be turned on when the scan signal of the gate-on voltage is supplied to the third scan line SL+1 to supply the voltage of the initialization power source Vint to the first electrode RFE1 of the light emitting element LD. The scan signal supplied to the third scan line SL+1 may have the same waveform as the scan signal supplied to the first scan line of the pixel of the next stage.

FIG. 7 shows an embodiment of the present disclosure in which the gate electrode of the seventh transistor T7 is connected to the third scan line SL+1. However, the technical spirit of the present disclosure is not limited thereto. For example, in another embodiment of the present disclosure, the gate electrode of the seventh transistor T7 may be connected to the first scan line SL or the second scan line SL−1. In such a case, when the scan signal of the gate-on voltage is supplied to the first scan line SL or the second scan line SL−1, the voltage of the initialization power source Vint may be supplied to the anode electrode of the light emitting element LD via the seventh transistor T7.

The storage capacitor Cst may be connected between the first driving power source VDD and the first node N1. A voltage corresponding to the data signal and a threshold voltage of the first transistor T1 may be stored in the storage capacitor Cst.

In FIG. 7, transistors included in the driving circuit DC, for example, the first through seventh transistors T1 through T7 are shown as P-type transistors, but the present disclosure is not limited thereto. For example, at least one of the first through seventh transistors T1 through T7 may be changed to an N-type transistor.

Hereinafter, structures of pixels according to embodiments will be described with reference to FIGS. 8-18.

For convenience of description, hereinafter, each electrode is simplified and illustrated as a single electrode layer. However, the present disclosure is not limited thereto, and each electrode may be composed of a plurality of electrode layers. In one or more embodiments of the present disclosure, a phrase "formed and/or located in (or at) the same layer" may mean that they are formed in the same process and are formed of the same material.

In FIGS. 8-18, for convenience of description, transistors connected to the light emitting elements and signal wires connected to the transistors are omitted.

In addition, in FIGS. 8, 10, 12, 14 and 16, the light emitting elements LD are shown to be aligned so that the longitudinal direction corresponds to the first direction DR1, but the present disclosure is not limited thereto. For example, the light emitting elements LD may be aligned in a diagonal direction with respect to the first direction DR1.

Figure 9:
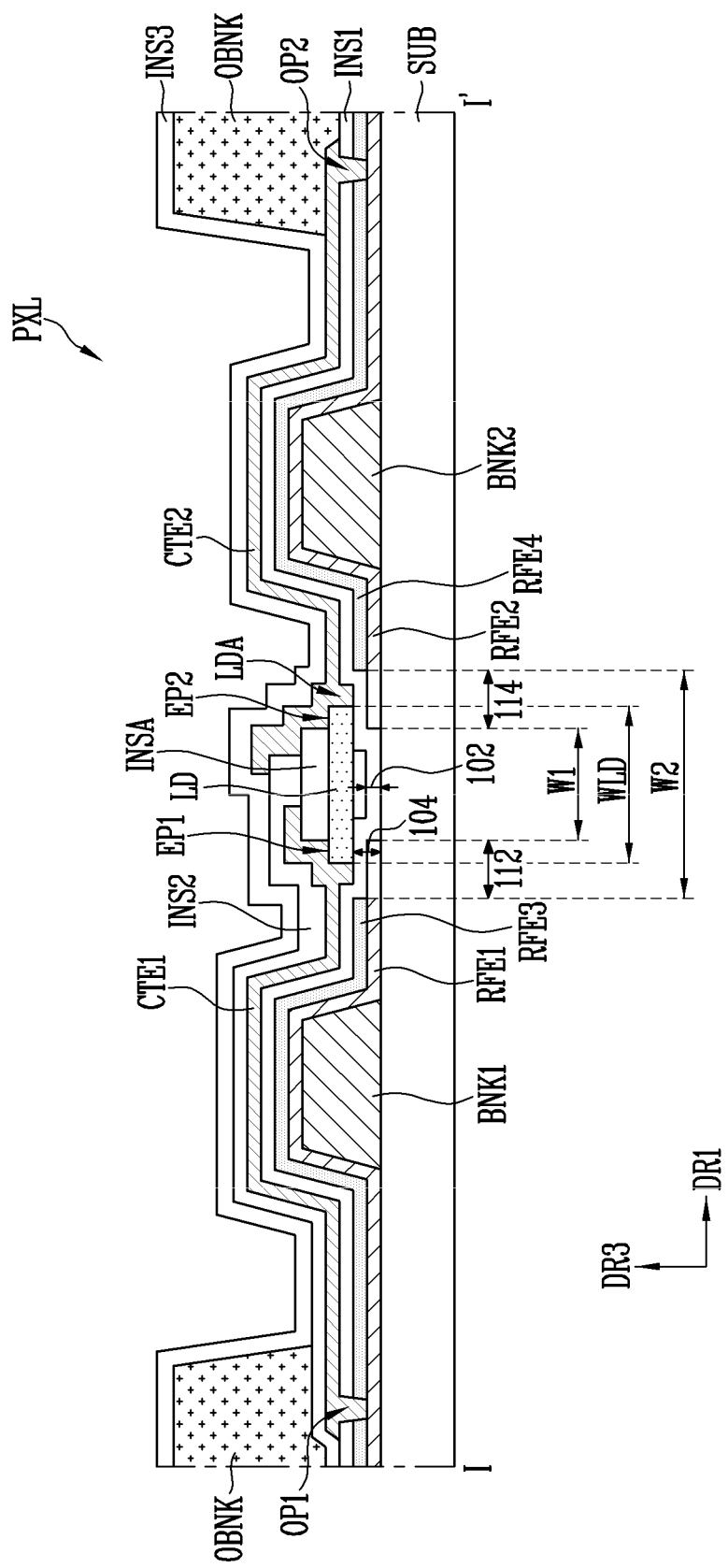
FIG. 9 is a cross-sectional view taken along the line I-I' of FIG. 8.

A pixel PXL according to one or more embodiments will be described with reference to FIGS. 8 and 9. FIGS. 8 and 9 may be drawings illustrating a pixel PXL according to one or more embodiments. FIG. 8 is a plan view schematically illustrating a pixel according to one or more embodiments. FIG. 9 is a cross-sectional view taken along the line I-I' of FIG. 8.

Referring to FIGS. 8 and 9, a pixel PXL according to one or more embodiments of the present disclosure may include a substrate SUB, a first electrode RFE1, a second electrode RFE2, a third electrode RFE3, a fourth electrode RFE4, and a first insulating layer INS1, and a light emitting element LD. The pixel PXL may further include a first bank BNK1, a second bank BNK2, an anchoring layer INSA, a fifth electrode CTE1, a sixth electrode CTE2, a second insulating layer INS2, a third insulating layer INS3, and a partition wall OBNK.

The pixel PXL shown in FIG. 8 may be any one of the first pixel PXL1, the second pixel PXL2, and the third pixel PXL3 described above with reference to FIG. 3.

Among the first to fourth electrodes RFE1 to RFE4, a pair of electrodes constituting each series stage may be located adjacent to a region in which the light emitting element LD is arranged. For example, the first electrode RFE1 and the second electrode RFE2 may extend along the second direction DR2 and may be spaced from each other along the first direction DR1. The third electrode RFE3 and the fourth electrode RFE4 may extend along the second direction DR2 and may be spaced from each other along the first direction DR1.

The light emitting element LD may be located between the first electrode RFE1 and the second electrode RFE2. The light emitting element LD may be located between the third electrode RFE3 and the fourth electrode RFE4. The light emitting element LD may be located in a sub-emission region SEA when viewed on a plan. The sub-emission region SEA may be a region within the emission region EMA including the region in which the light emitting element LD is arranged.

At least one of the first to fourth electrodes RFE1 to RFE4 may be a pixel electrode of each pixel PXL. After any one of the first to fourth electrodes RFE1 to RFE4 is formed as an alignment line, a portion of any one of the first to fourth electrodes RFE1 to RFE4 may be cut off between adjacent pixels PXL and/or sub-emission regions SEA of each pixel PXL to be separated into respective pixel electrodes.

The first to fourth electrodes RFE1 to RFE4 may be electrically connected to the light emitting element LD through respective contact electrodes (for example, the fifth electrode CTE1 and/or the sixth electrode CTE2).

At least a portion of the fifth electrode CTE1 may be connected to a first end EP1 of the light emitting element LD to connect the first electrode RFE1 and the light emitting element LD. At least a portion of the sixth electrode CTE2 may be connected to a second end EP2 of the light emitting element LD to connect the second electrode RFE2 and the light emitting element LD.

The fifth electrode CTE1 may be connected to the first electrode RFE1 through a first opening OP1. The sixth electrode CTE2 may be connected to the second electrode RFE2 through a second opening OP2.

The first opening OP1 may be formed in the third electrode RFE3 and the first insulating layer INS1. The second opening OP2 may be formed in the fourth electrode RFE4 and the first insulating layer INS1. The first opening OP1 and the second opening OP2 may have a hole shape.

Here, the first opening OP1 and the second opening OP2 may be positioned in a non-emission region NEA. Accordingly, the fifth electrode CTE1 may be electrically connected to the first electrode RFE1 in the non-emission region NEA, and the sixth electrode CTE2 may be connected to the second electrode RFE2 in the non-emission region NEA.

The non-emission region NEA may refer to a region where light is not emitted. The non-emission region NEA may be a region other than the emission region EMA. According to an example, the non-emission region NEA may be a region in which the light emitting element LD is not arranged, and may refer to a region in which the partition wall OBNK is arranged. Alternatively, the non-emission region NEA may be a region in which the light emitting element LD and the partition wall OBNK are not located, and may include a region (for example, an open region 110) from which at least a portion is removed so that any one of the first to fourth electrodes RFE1 to RFE4 is provided as the pixel electrode. According to an example, the first opening OP1 may not overlap the light emitting element LD along the first direction DR1. The second opening OP2 may not overlap the light emitting element LD along the first direction DR1.

According to some embodiments, the first opening OP1 and the second opening OP2 may be positioned in the region where the light emitting element LD and the partition wall OBNK are not located, or may be located in the open region 110 although not shown in the drawings.

Referring to FIG. 9, the substrate SUB may be a rigid substrate or a flexible substrate. Material and physical properties of the substrate SUB are not particularly limited. For example, the substrate SUB may be the rigid substrate made of glass or tempered glass, or the flexible substrate composed of a thin film made of plastic or metal. In one or more embodiments, the substrate SUB may be a transparent substrate, but the present disclosure is not limited thereto. For example, the substrate SUB may be a translucent substrate, an opaque substrate, or a reflective substrate.

The first bank BNK1 and the second bank BNK2 may be located on the substrate SUB. A space in which the light emitting element LD is to be located may be provided between the first bank BNK1 and the second bank BNK2. In one or more embodiments, the first bank BNK1 and the second bank BNK2 may be spaced from each other at a distance greater than the length of the light emitting element LD along the first direction DR1 on the substrate SUB. The first bank BNK1 and the second bank BNK2 may be located at the same layer as each other, and may have the same height. However, the present disclosure is not limited thereto. Also, the first bank BNK1 and the second bank BNK2 may extend along the second direction DR2 crossing the first direction DR1.

The first bank BNK1 and the second bank BNK2 may be an insulating material including an organic material or an inorganic material, but the present disclosure is not limited thereto. Further, the first bank BNK1 and the second bank BNK2 may be formed of a single layer, but the present disclosure is not limited thereto. The first bank BNK1 and the second bank BNK2 may be formed of multiple layers. In this case, the first bank BNK1 and the second bank BNK2 may have a structure in which at least one organic insulating layer and at least one inorganic insulating layer are stacked.

In one or more embodiments, each of the first bank BNK1 and the second bank BNK2 may have a shape protruding in a display direction of the light emitting element LD. Each side surface of the cross sections of the first bank BNK1 and the second bank BNK2 may have a trapezoidal shape inclined at an angle (e.g., a set angle or a predetermined angle). However, the shapes of the cross sections of the first bank BNK1 and the second bank BNK2 are not limited thereto, and may have various shapes such as a semi-elliptical shape, a circular shape, and a square shape.

The first and second electrodes RFE1 and RFE2 may be located on the corresponding first and second banks BNK1 and BNK2, respectively. For example, the first electrode RFE1 may be provided on the first bank BNK1, and the second electrode RFE2 may be provided on the second bank BNK2.

In one or more embodiments, the first electrode RFE1 and the second electrode RFE2 may be spaced from each other. The first electrode RFE1 and the second electrode RFE2 may be spaced t from each other at a first distance W1 along the first direction DR1. Here, the first distance W1 may be smaller than a length WLD of the light emitting element LD, which will be described later. Accordingly, when the light emitting element LD is located in a center portion between the first electrode RFE1 and the second electrode RFE2, at least a portion of the first electrode RFE1 and at least a portion of the second electrode RFE2 may overlap the light emitting element LD in a third direction DR3, respectively.

In one or more embodiments, the first electrode RFE1 and the second electrode RFE2 may extend in the second direction DR2 in a plane.

The first electrode RFE1 and the second electrode RFE2 may have a substantially uniform thickness along the surfaces of the first bank BNK1 and the second bank BNK2. The first electrode RFE1 and the second electrode RFE2 may be provided to correspond to the shapes of the first bank BNK1 and the second bank BNK2. For example, the first electrode RFE1 may have a shape corresponding to the inclination of the first bank BNK1, and the second electrode RFE2 may have a shape corresponding to the inclination of the second bank BNK2.

The first electrode RFE1 and the second electrode RFE2 may be located at the same plane with each other, and may have substantially the same thickness. Also, the first electrode RFE1 and the second electrode RFE2 may be concurrently (e.g., simultaneously) formed in the same process.

The first electrode RFE1 and the second electrode RFE2 may include a conductive material. For example, the first electrode RFE1 and the second electrode RFE2 may include a transparent conductive material such as indium tin oxide (ITO), indium zinc oxide (IZO), zinc oxide (ZnO), and indium tin zinc oxide (ITZO). However, the present disclosure is not limited thereto.

For convenience of description, although the first and second electrodes RFE1 and RFE2 are shown provided directly on the substrate SUB, the present disclosure is not limited thereto. For example, a component for driving the display device to be a passive matrix or an active matrix may be further provided between the first and second electrodes RFE1 and RFE2 and the substrate SUB. The component may be the circuit elements of the pixel PXL described with reference to FIGS. 4-7. For example, a transistor connected to at least one of the first and second electrodes RFE1 and RFE2 may be positioned between the first and second electrodes RFE1 and RFE2 and the substrate SUB.

The third electrode RFE3 and the fourth electrode RFE4 may be located on the first electrode RFE1 and the second electrode RFE2, respectively. For example, the third electrode RFE3 may be provided on the first electrode RFE1, and the fourth electrode RFE4 may be provided on the second electrode RFE2. The third electrode RFE3 and the fourth electrode RFE4 may be spaced from each other.

In some embodiments, the third electrode RFE3 may be directly formed on the first electrode RFE1 to contact the first electrode RFE1. Similarly, the fourth electrode RFE4 may be directly formed on the second electrode RFE2 to contact the second electrode RFE2.

The third electrode RFE3 and the fourth electrode RFE4 may be spaced from each other at a second distance W2 along the first direction DR1. Here, the second distance W2 between the third electrode RFE3 and the fourth electrode RFE4 may be greater than the first distance W1 between the first electrode RFE1 and the second electrode RFE2. In one or more embodiments, the second distance W2 between the third electrode RFE3 and the fourth electrode RFE4 may be greater than the length WLD of the light emitting element LD, which will be described later.

Because the second distance W2 between the third electrode RFE3 and the fourth electrode RFE4 is greater than the length WLD of the light emitting element LD, the light emitting element LD may not overlap the third electrode RFE3 and the fourth electrode RFE4. For example, by adjusting the second distance W2 between the third electrode RFE3 and the fourth electrode RFE4, the space in which the light emitting element LD is to be located may be controlled (or limited). Accordingly, the light emitting element LD may be located at a desired position.

In one or more embodiments, the third electrode RFE3 and the fourth electrode RFE4 may extend in the second direction DR2 on a plane.

The third electrode RFE3 and the fourth electrode RFE4 may have a substantially uniform thickness along the surfaces of the first electrode RFE1 and the second electrode RFE2. The third electrode RFE3 and the fourth electrode RFE4 may be provided to correspond to the shapes of the first electrode RFE1 and the second electrode RFE2. For example, the third electrode RFE3 may have a shape corresponding to the inclination of the first electrode RFE1, and the fourth electrode RFE4 may have a shape corresponding to the inclination of the second electrode RFE2.

The third electrode RFE3 and the fourth electrode RFE4 may be located at the same plane with each other, and may have substantially the same thickness. Also, the third electrode RFE3 and the fourth electrode RFE4 may be concurrently (e.g., simultaneously) formed in the same process.

The third electrode RFE3 and the fourth electrode RFE4 may be made of a conductive material. For example, the third electrode RFE3 and the fourth electrode RFE4 may include metal such as Al, Mg, Ag, Pt, Pd, Au, Ni, Nd, Ir, Cr, Ti, or alloys thereof.

However, the third electrode RFE3 and the fourth electrode RFE4 may be made of different materials from the above-described first electrode RFE1 and second electrode RFE2. For example, the third electrode RFE3 and the fourth electrode RFE4 may be made of a conductive material having a fast side etching rate in a wet etching process, compared to the first electrode RFE1 and the second electrode RFE2. Descriptions related to this will be described later with reference to FIGS. 19-31.

In one or more embodiments, the third electrode RFE3 and the fourth electrode RFE4 may be made of a material having higher electrical conductivity (e.g., a material having a low resistivity) than the first electrode RFE1 and the second electrode RFE2.

Here, the materials of the third electrode RFE3 and the fourth electrode RFE4 are not limited to the materials described above. For example, the third electrode RFE3 and the fourth electrode RFE4 may include a conductive material having a constant reflectance. When the third electrode RFE3 and the fourth electrode RFE4 are made of the conductive material having the constant reflectance, light emitted from the first end EP1 and the second end EP2 of the light emitting element LD may be reflected by the third electrode RFE3 and the fourth electrode RFE4 and proceed in the display direction (for example, the third direction DR3).

In one or more embodiments, the third electrode RFE3 and the fourth electrode RFE4 may have shapes corresponding to the shapes of the first electrode RFE1 and the second electrode RFE2 (or the first bank BNK1 and the second bank BNK2), and may have constant angles with respect to the substrate SUB. The light emitted from the first end EP1 and the second end EP2 of each light emitting element LD may be reflected by the third electrode RFE3 and the fourth electrode RFE4 and further proceed in the third direction DR3. Accordingly, light output efficiency of the display device can be improved.

The third electrode RFE3 may include the first opening OP1, and the fourth electrode RFE4 may include the second opening OP2. The first opening OP1 of the third electrode RFE3 may expose the first electrode RFE1. The second opening OP2 of the fourth electrode RFE4 may expose the second electrode RFE2.

Referring to FIG. 9, the first opening OP1 may not overlap the first bank BNK1, and the second opening OP2 may not overlap the second bank BNK2. For example, each of the first opening OP1 and the second opening OP2 may overlap the partition wall OBNK. The first opening OP1 may be positioned between the partition wall OBNK and the substrate SUB, and the second opening OP2 may be positioned between the partition wall OBNK and the substrate SUB.

The first electrode RFE1 and the third electrode RFE3 described above may be in contact with each other to form a first pixel electrode, and the second electrode RFE2 and fourth electrode RFE4 may be in contact with each other to form a second pixel electrode. Here, one of the first and second pixel electrodes may be the anode electrode, and the other one of the first and second pixel electrodes may be the cathode electrode. For example, the first pixel electrode may be the cathode electrode, and the second pixel electrode may be the anode electrode. However, the present disclosure is not limited to this, and may include the opposite case.

The first pixel electrode and the second pixel electrode may provide a driving signal to the light emitting element LD, and the light emitting element LD may emit light corresponding to the provided driving signal.

Referring to FIG. 4 further, the first pixel electrode and the second pixel electrode may be electrically connected to any one of the driving circuit DC and the second driving power source VSS through separate connecting wirings or connecting members, respectively. For example, the first pixel electrode may be electrically connected to the second driving power source VSS, and the second pixel electrode may be electrically connected to the driving circuit DC. For example, at least one of the first electrode RFE1 and the third electrode RFE3 may be connected to the second driving power source VSS, and at least one of the second electrode RFE2 and the fourth electrode RFE4 may be connected to the driving circuit DC. However, the connection relationship between the first pixel electrode and the second pixel electrode is not limited to the above, and may include the opposite case.

The first pixel electrode and the second pixel electrode may be respectively connected to the first end EP1 and the second end EP2 of the light emitting element LD to provide the driving signal to the light emitting element LD. The light emitting element LD may emit light having a luminance (e.g., a set luminance or a predetermined luminance) in response to the driving current provided from the driving circuit DC.

The first insulating layer INS1 may be provided on the third electrode RFE3 and the fourth electrode RFE4. The first insulating layer INS1 may be provided on an entire surface of the substrate SUB to cover the first and second banks BNK1 and BNK2, and the first to fourth electrodes RFE1, RFE2, RFE3, and RFE4. In one or more embodiments, the first insulating layer INS1 may be located along a surface of the substrate SUB in which the first and second banks BNK1 and BNK2, and the first to fourth electrodes RFE1, RFE2, RFE3, and RFE4 are not located. The first insulating layer INS1 may include an inorganic material or an organic material. According to an example, the inorganic material may include any one of silicon nitride (SiNx), silicon oxide (SiOx), silicon oxynitride (SiOxNy), aluminum oxide (AlOx), zirconium oxide (ZrOx), and hafnium oxide (HfOx). The organic material may include at least one of acrylic resin, methacrylic resin, polyisoprene, vinyl resin, epoxy resin, urethane resin, cellulose resin, siloxane resin, polyimide resin, polyamide resin, and perylene resin.

In one or more embodiments, the first insulating layer INS1 may include the first opening OP1 and the second opening OP2. The first opening OP1 may expose at least a portion of the first electrode RFE1. The second opening OP2 may expose at least a portion of the second electrode RFE2.

The first opening OP1 may have a thickness and/or a depth corresponding to the sum of the thickness of the first insulating layer INS1 and the thickness of the third electrode RFE3. For example, the first opening OP1 may penetrate the first insulating layer INS1 and the third electrode RFE3 in a corresponding region.

The second opening OP2 may have a thickness and/or a depth corresponding to the sum of the thickness of the first insulating layer INS1 and the thickness of the fourth electrode RFE4. For example, the second opening OP2 may penetrate the first insulating layer INS1 and the fourth electrode RFE4 in a corresponding region.

Accordingly, at least a portion of each of the first electrode RFE1 and the second electrode RFE2 may be exposed to outside and may contact the fifth electrode CTE1 and the sixth electrode CTE6, which will be described later.

The light emitting element LD may be located on the first insulating layer INS1. The light emitting element LD may be located in the space provided by the first bank BNK1 and the second bank BNK2. In one or more embodiments, in a plan view, the light emitting element LD may be located between the third electrode RFE3 and the fourth electrode RFE4. For example, the light emitting element LD may not overlap the third electrode RFE3 and the fourth electrode RFE4.

The first distance W1 between the first and second electrodes RFE1 and RFE2 and the second distance W2 between the third and fourth electrodes RFE3 and RFE4 may be different from each other. Accordingly, steps may be generated between the first and second electrodes RFE1 and RFE2 and the third and fourth electrodes RFE3 and RFE4, respectively. The light emitting element LD may be located in a recess (or a light emitting element region LDA) formed by the steps.

For example, the first insulating layer INS1 may have a step (e.g., a set step or a predetermined step) along the surfaces of the first to fourth electrodes RFE1, RFE2, RFE3, and RFE4.

For example, the first insulating layer INS1 positioned in a region where the first electrode RFE1 and the second electrode RFE2 are not arranged may have a first height 102 from the substrate SUB. In one or more embodiments, the first insulating layer INS1 positioned in a region in which the third and fourth electrodes RFE3 and RFE4 are not arranged and the first and second electrodes RFE1 and RFE2 are arranged may have a second height 104 that is greater than the first height 102 from the substrate SUB.

The first electrode RFE1 may include a first region 112 that is not covered by the third electrode RFE3, and the second electrode RFE2 may include a second region 114 that is not covered by the fourth electrode RFE4. Here, the first end EP1 of the light emitting element LD may be positioned on the first insulating layer INS1 positioned in the first region 112, and the second end EP2 of the light emitting element LD may be positioned on the first insulating layer INS1 positioned in the second region 114.

Accordingly, the light emitting element region LDA may be provided on the first insulating layer INS1 where the first and second electrodes RFE1 and RFE2 overlap portions exposed from the third and fourth electrodes RFE3 and RFE4.

For example, at least a portion of an upper surface of the first electrode RFE1 may be exposed without being covered by the third electrode RFE3, and at least a portion of an upper surface of the second electrode RFE2 may be exposed without being covered by the fourth electrode RFE4. The light emitting element LD may be located in a region (for example, the light emitting element region LDA) where the first and second electrodes RFE1 and RFE2 are exposed.

The length WLD of the light emitting element LD may be greater than the first distance W1 between the first and second electrodes RFE1 and RFE2, and may be less than the second distance W2 between the third and fourth electrodes RFE3 and RFE4. For example, at least a portion of the first electrode RFE1 and at least a portion of the second electrode RFE2 may overlap the light emitting element LD in the third direction DR3, and the third electrode RFE3 and the fourth electrode RFE4 may not overlap the light emitting element LD in the third direction DR3.

The anchoring layer INSA for stably supporting and fixing the light emitting element LD may be located on the light emitting element LD. The anchoring layer INSA may be an inorganic insulating layer including an inorganic material or an organic insulating layer including an organic material. The anchoring layer INSA may cover at least a portion of the outer peripheral surface of each light emitting element LD, and may be formed to expose the first end EP1 and the second end EP2 of the light emitting element LD. Accordingly, because the anchoring layer INSA stably supports and fixes the light emitting element LD, the light emitting element LD may not be separated from the substrate SUB. According to one or more embodiments, the anchoring layer INSA may be located to fill a space between the light emitting element LD and the first insulating layer INS1. The anchoring layer INSA may be omitted according to process conditions of the display device.

The fifth electrode CTE1 (or a first contact electrode) and the sixth electrode CTE2 (or a second contact electrode) may be located on the first insulating layer INS1, the light emitting element LD, and the anchoring layer INSA. Also, the second insulating layer INS2 may be provided between the fifth electrode CTE1 and the sixth electrode CTE2.

The fifth electrode CTE1 and the sixth electrode CTE2 may contact one end of both ends EP1 and EP2 of each light emitting element LD. For example, the fifth electrode CTE1 may be in contact with the first end EP1 of each light emitting element LD, and the sixth electrode CTE2 may be in contact with the second end EP2 of each light emitting element LD. The fifth electrode CTE1 may be electrically connected through the first end EP1 of the light emitting element LD, and the sixth electrode CTE2 may be electrically connected through the second end EP2 of the light emitting element LD.

The fifth electrode CTE1 may overlap at least a portion of each of the first electrode RFE1 and the third electrode RFE3 when viewed on a plan (e.g., in a plan view)

The fifth electrode CTE1 may be connected to the first electrode RFE1 through the first opening OP1 formed in the first insulating layer INS1 and the third electrode RFE3. The fifth electrode CTE1 may contact the first electrode RFE1 on the first bank BNK1. The fifth electrode CTE1 may be in physical contact with at least a portion of the first electrode RFE1.

The fifth electrode CTE1 may directly receive an electrical signal from the first electrode RFE1. At least a portion of the fifth electrode CTE1 may be in physical contact with the first electrode RFE1 and may be directly electrically connected to the first electrode RFE1.

The sixth electrode CTE2 may be connected to the second electrode RFE2 through the second opening OP2 formed in the first insulating layer INS1 and the fourth electrode RFE4. The sixth electrode CTE2 may contact the second electrode RFE2 on the second bank BNK2. The sixth electrode CTE2 may be in physical contact with at least a portion of the second electrode RFE2.

The sixth electrode CTE2 may directly receive an electrical signal from the second electrode RFE2. At least a portion of the sixth electrode CTE2 may be in physical contact with the second electrode RFE2 and may be directly electrically connected to the second electrode RFE2.

According to an example, a region where the fifth electrode CTE1 and the first electrode RFE1 are connected may not overlap the first bank BNK1, and a region where the sixth electrode CTE2 and the second electrode RFE2 are connected may not overlap the 2 bank BNK2. in a plan view The region where the fifth electrode CTE1 and the first electrode RFE1 are connected, and the region where the sixth electrode CTE2 and the second electrode RFE2 are connected may be positioned in the non-emission region NEA.

The region where the fifth electrode CTE1 and the first electrode RFE1 are connected may be positioned under the partition wall OBNK arranged in the non-emission region NEA, and the region where the sixth electrode CTE2 and the second electrode RFE2 are connected may be positioned under the partition wall OBNK arranged in the non-emission region NEA.

As described above, the fifth electrode CTE1 and the sixth electrode CTE2 configured to function as contact electrodes for the light emitting element LD may be directly connected to the first electrode RFE1 and the second electrode RFE2, respectively, and may directly receive electrical signals from the first electrode RFE1 and the second electrode RFE2. Therefore, loss of the electrical signals generated in a process of moving along the electrode may be prevented, and distortion of the electrical signals may be prevented. Accordingly, reliability of the display device 1000 can be improved.

Each of the fifth and sixth electrodes CTE1 and CTE2 may be made of a transparent conductive material. For example, the transparent conductive material may include ITO (Indium Tin Oxide), IZO (Indium Zinc Oxide), ZnO (Zinc Oxide) and ITZO (Indium Tin-Zinc Oxide). When the fifth electrode CTE1 and the sixth electrode CTE2 are made of the transparent conductive material, light loss may be reduced when the light emitted from the light emitting element LD travels in the third direction DR3. The materials of the fifth electrode CTE1 and the sixth electrode CTE2 are not limited to the materials described above.

The second insulating layer INS2 may be located between the fifth electrode CTE1 and the sixth electrode CTE2. For example, the second insulating layer INS2 may include an inorganic insulating layer made of an inorganic material. The second insulating layer INS2 may be located to cover one of the fifth electrode CTE1 and the sixth electrode CTE2, and another electrode may be located on the second insulating layer INS2. For example, the second insulating layer INS2 may be located on the fifth electrode CTE1 to cover the fifth electrode CTE1. The sixth electrode CTE2 may be located on the second insulating layer INS2. For example, the fifth electrode CTE1 and the sixth electrode CTE2 may be electrically separated by the second insulating layer INS2.

However, the arrangement of the fifth electrode CTE1 and the sixth electrode CTE2 is not limited thereto. For example, the fifth electrode CTE1 and the sixth electrode CTE2 may be located at the same layer. In such a case, the fifth electrode CTE1 and the sixth electrode CTE2 may be formed substantially concurrently (e.g., at the same time). Accordingly, a manufacturing process of the display device can be simplified and the manufacturing cost of the display device can be reduced.

The third insulating layer INS3 may be located on the fifth and sixth electrodes CTE1 and CTE2 and the second insulating layer INS2. The third insulating layer INS3 may prevent damage to the first to sixth electrodes RFE1, RFE2, RFE3, RFE4, CTE1, and CTE2 and the light emitting element LD during the manufacturing process of the display device, and serve as an encapsulation layer to prevent penetration of oxygen and moisture.

The third insulating layer INS3 may be formed of an inorganic insulating layer including an inorganic material. The third insulating layer INS3 may be formed as a single layer. However, the present disclosure is not limited thereto, and the third insulating layer INS3 may include a multi-layer structure. When the third insulating layer INS3 includes the multi-layer structure, the third insulating layer INS3 may further include an organic insulating layer including an organic material, and may include a multi-layer structure in which the organic insulating layer and the inorganic insulating layer are alternately located.

The partition wall OBNK may have a structure surrounding at least a portion of the pixel PXL. The partition wall OBNK may have a shape protruding in the display direction of the light emitting element LD. The partition wall OBNK may define the emission region EMA of the pixel PXL. A region in which the partition wall OBNK is arranged may be included in the non-emission region NEA. The partition wall OBNK may include a light blocking material and/or a reflective material to prevent light leakage defects in which light leaks between adjacent pixels PXL. The partition wall OBNK may be omitted depending on the process conditions of the display device.

Although not shown in the drawings, in some embodiments, a planarization layer may be further provided on the third insulating layer INS3. The planarization layer may reduce steps generated by various configurations located under the planarization layer. An upper surface of the planarization layer may be generally flat. The planarization layer may include an organic insulating layer. However, the present disclosure is not limited thereto, and the planarization layer may further include an inorganic insulating layer.

In the process of aligning the light emitting element LD, when the light emitting element LD is located closer to the first electrode RFE1 or the third electrode RFE3, eccentricity defect may occur. For example, the eccentricity defect may be defined as a defect indicating a state in which a center point of the light emitting element LD is deviated from a center between the first electrode RFE1 and the second electrode RFE2. When the eccentricity defect occurs, the light emitting element LD may not normally contact the pixel electrodes in a subsequent process, and thus, the light may not be emitted because the driving signal is not supplied.

As described above, the pixel PXL according to one or more embodiments may include the first and second electrodes RFE1 and RFE2 spaced from each other by the first distance W1 and the third and fourth electrodes RFE3 and RFE4 spaced from each other by the second distance W2 greater than the first distance W1, and the light emitting element LD may be located between the steps generated by the first and second electrodes RFE1 and RFE2 and the third and fourth electrodes RFE3 and RFE4.

Through this, the light emitting element LD may be located at an accurate position (for example, between the third and fourth electrodes RFE3 and RFE4), and the eccentricity defect in which the light emitting element LD is located closer to the first electrode RFE1 (or the third electrode RFE3) or the second electrode RFE2 (or the fourth electrode RFE4) may be prevented. For example, the reliability of the display device can be improved.

Hereinafter, another embodiment of the pixel will be described. In the following embodiment, the same reference numerals are given to the same components as the previously described embodiments, and descriptions thereof will be omitted or simplified, and differences will be mainly described.

Figure 10:
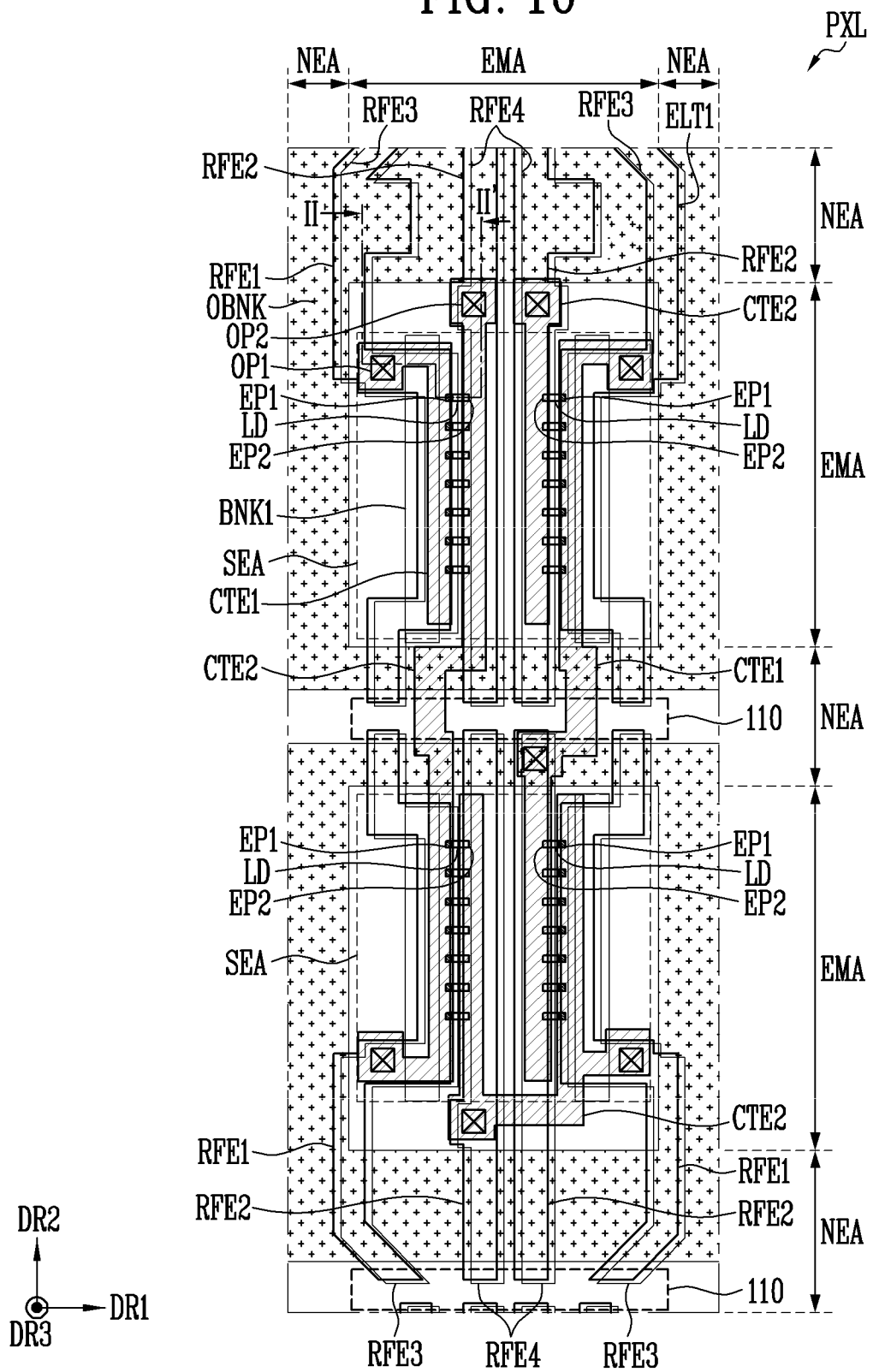
FIG. 10 is a plan view schematically illustrating a pixel according to another embodiment of the present disclosure.
Figure 11:
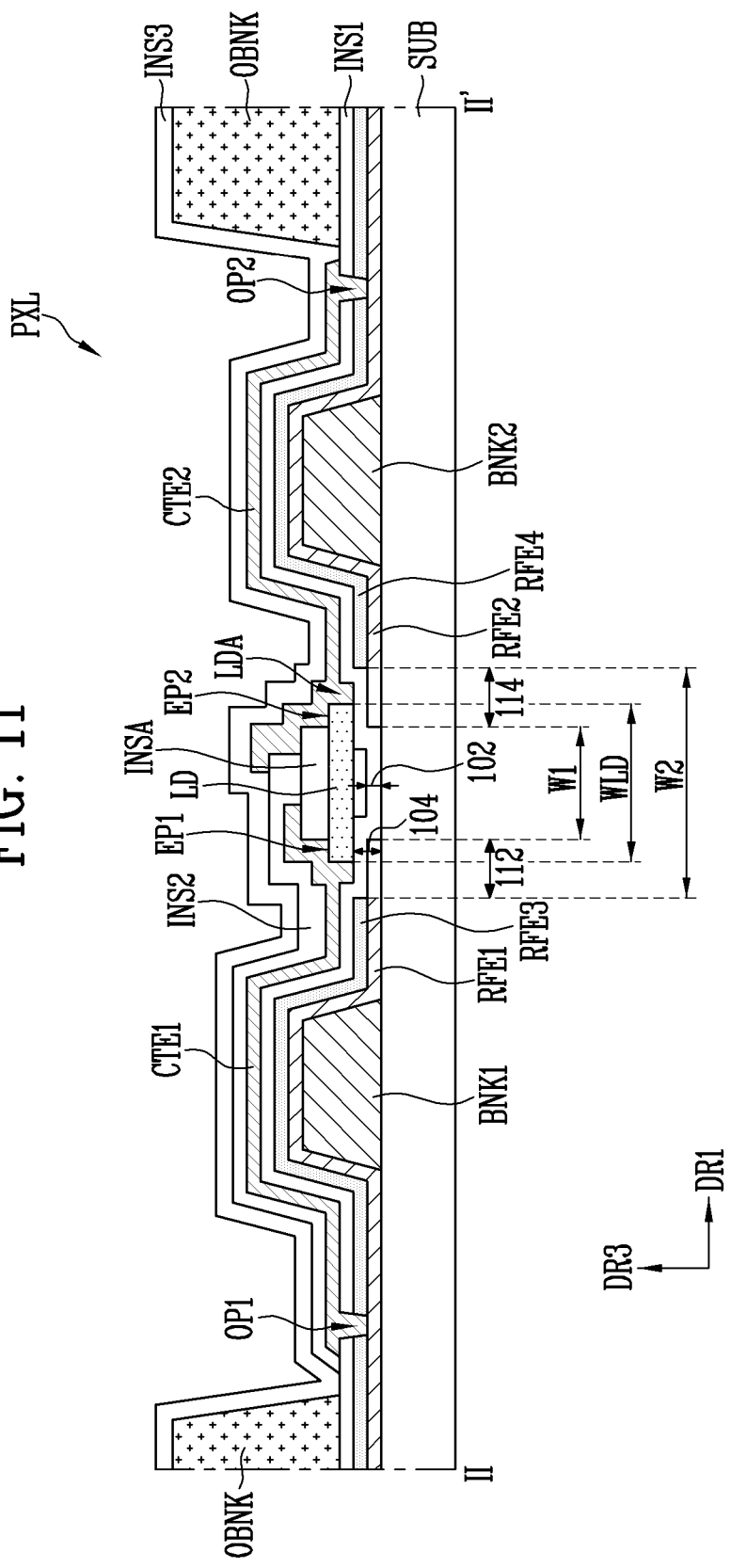
FIG. 11 is a cross-sectional view taken along the line II-II' of FIG. 10.

FIGS. 10 and 11 may be drawings illustrating a pixel PXL according to another embodiment. FIG. 10 is a plan view schematically illustrating a pixel according to another embodiment of the present disclosure. FIG. 11 is a cross-sectional view taken along the line II-II' of FIG. 10.

According to the present embodiment, the position of the first opening OP1 and the position of the second opening OP2 are different from the positions of each of the openings according to the above-described embodiments (e.g., see, FIG. 9).

Referring to FIGS. 10 and 11, the first opening OP1 and the second opening OP2 may be positioned in the emission region EMA. The first opening OP1 and the second opening OP2 may not overlap the partition wall OBNK. The first opening OP1 may not overlap the first bank BNK1, and the second opening OP2 may not overlap the second bank BNK2.

Accordingly, the fifth electrode CTE1 may be connected to the first electrode RFE1 in a region where the first bank BNK1 is not located. The sixth electrode CTE2 may be connected to the second electrode RFE2 in a region where the second bank BNK2 is not located.

Figure 12:
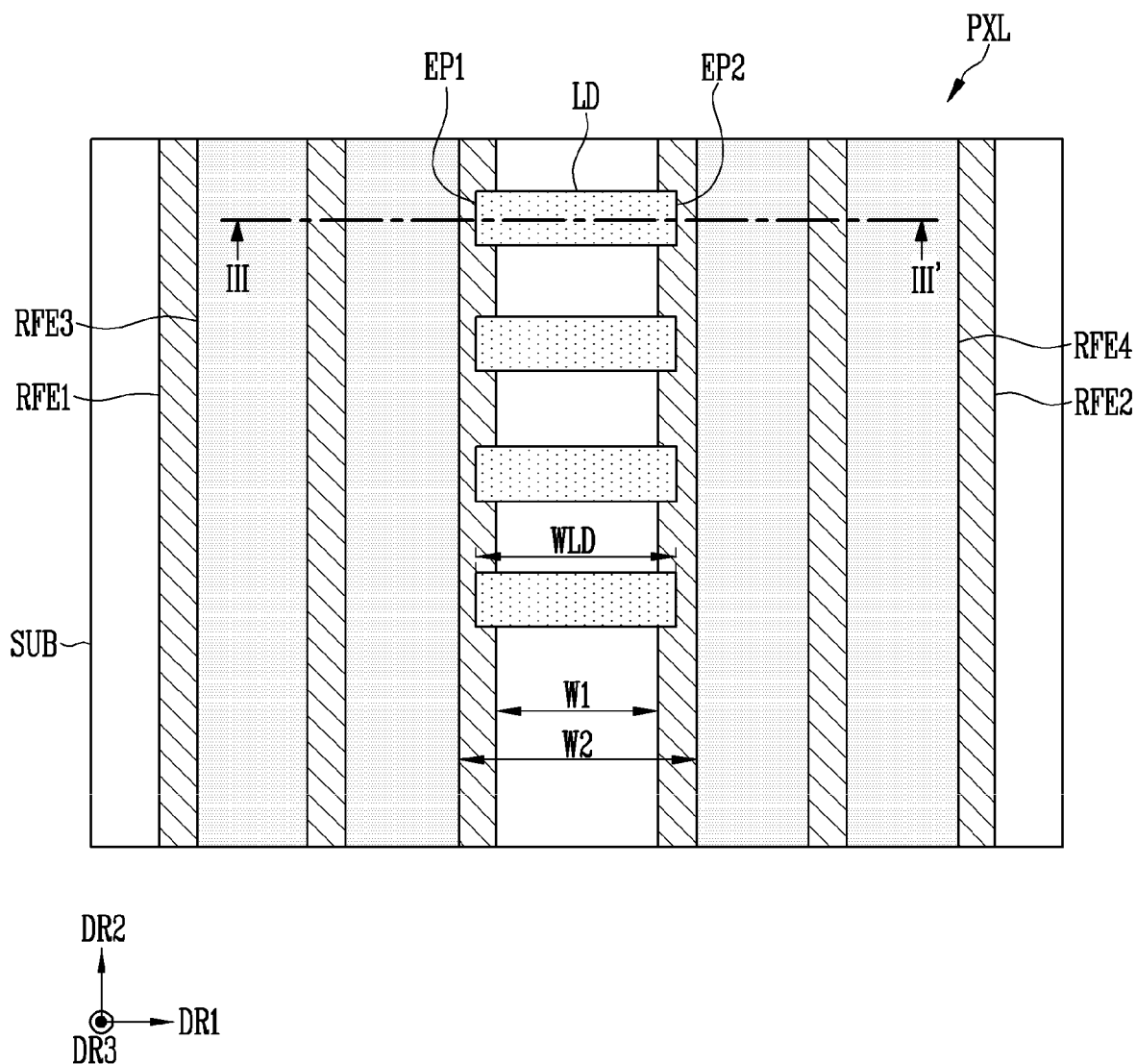
FIG. 12 is a plan view schematically illustrating a pixel according to still another embodiment of the present disclosure.
Figure 13:
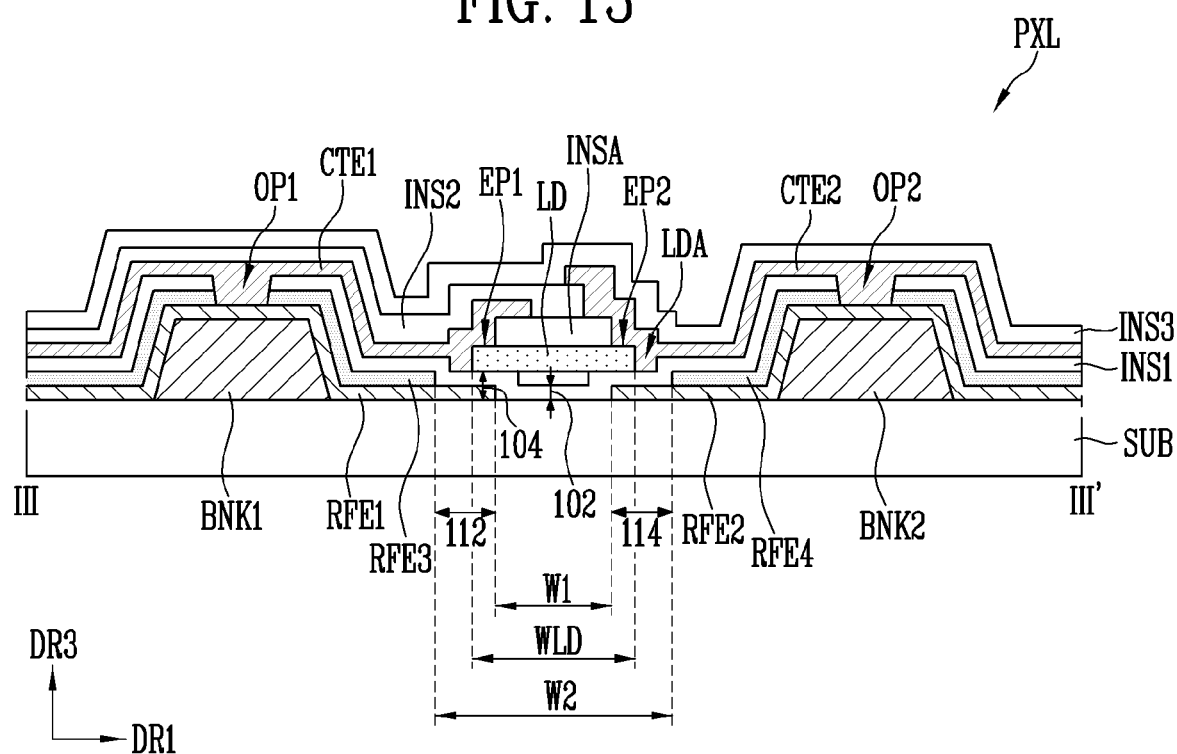
FIG. 13 is a cross-sectional view taken along the line III-III' of FIG. 12.

FIG. 12 is a plan view schematically illustrating a pixel according to still another embodiment of the present disclosure. FIG. 13 is a cross-sectional view taken along the line III-III' of FIG. 12. In FIG. 12, a structure of the pixel PXL is schematically shown for convenience of description.

According to the present embodiment, the position of the first opening OP1 and the position of the second opening OP2 are different from the positions of each of the openings according to the above-described embodiments (e.g., see, FIGS. 9 and 11).

Referring to FIGS. 12 and 13, the first opening OP1 may overlap the first bank BNK1, and the second opening OP2 may overlap the second bank BNK2. The first opening OP1 may be positioned on the first bank BNK1. The second opening OP2 may be positioned on the second bank BNK2.

For example, according to the present embodiment, the fifth electrode CTE1 may be connected to the first electrode RFE1 on the first bank BNK1. The sixth electrode CTE2 may be connected to the second electrode RFE2 on the second bank BNK2.

Figure 14:
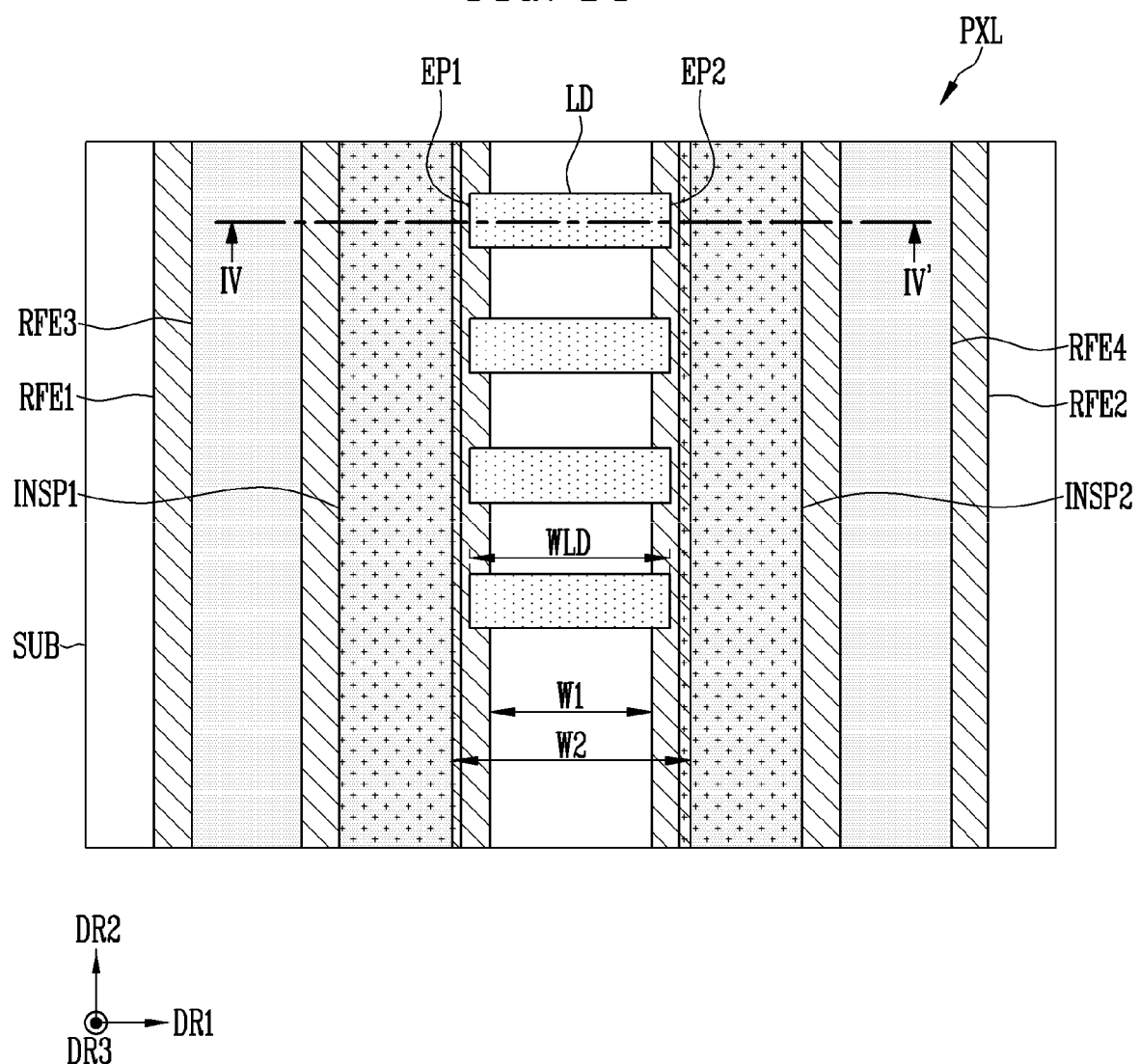
FIG. 14 is a plan view schematically illustrating a pixel according to still another embodiment of the present disclosure.
Figure 15:
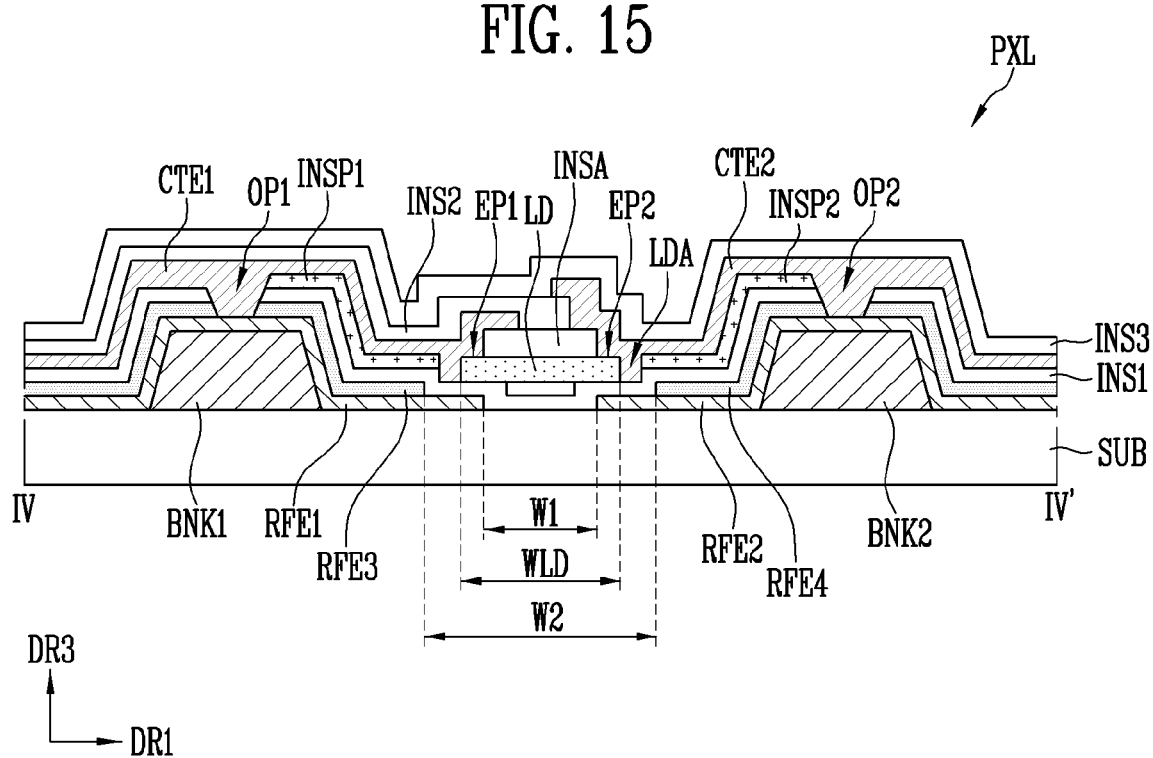
FIG. 15 is a cross-sectional view taken along the line IV-IV of FIG. 14.

FIGS. 14 and 15 may be drawings illustrating a pixel PXL according to still another embodiment. FIG. 14 is a plan view schematically illustrating a pixel according to still another embodiment of the present disclosure. FIG. 15 is a cross-sectional view taken along the line IV-IV' of FIG. 14. In FIG. 14, a structure of the pixel PLX is schematically shown for convenience of description.

Referring to FIGS. 14 and 15, a first insulating pattern INSP1 and a second insulating pattern INSP2 may be located on the first insulating layer INS1.

The first insulating pattern INSP1 and the second insulating pattern INSP2 may be spaced from each other along the first direction DR1 on the first insulating layer INS1 and may cover at least a portion of the first insulating layer INS1.

The first insulating pattern INSP1 and the second insulating pattern INSP2 may be located to extend up to the steps generated in the first insulating layer INS1, but the present disclosure is not limited thereto. In another embodiment, the first insulating pattern INSP1 and the second insulating pattern INSP2 may be spaced from each other at the same distance as the second distance W2 along the first direction DR1. In another embodiment, the first insulating pattern INSP1 and the second insulating pattern INSP2 may be spaced from each other at a distance greater than the second distance W2.

In one or more embodiments, the first insulating pattern INSP1 and the second insulating pattern INSP2 may extend along the second direction DR2 on a plane.

Even when the first insulating pattern INSP1 and the second insulating pattern INSP2 are located on the first insulating layer INS1, the first insulating layer INS1 and the third electrode RFE3 may include the first opening OP1 and expose at least a portion of the first electrode RFE1. In one or more embodiments, the first insulating layer INS1 and the fourth electrode RFE4 may include the second opening OP2 and expose at least a portion of the second electrode RFE2.

The first insulating pattern INSP1 and the second insulating pattern INSP2 may be an organic insulating layer including an organic material or an inorganic insulating layer including an inorganic material. When the first insulating pattern INSP1 and the second insulating pattern INSP2 are made of the organic insulating layer, the manufacturing process may be simplified.

According to the present embodiment, heights of the steps generated in the first insulating layer INS1 may be further increased by the first and second insulating patterns INSP1 and INSP2. For example, the height of the recess (or the light emitting element region LDA) in which the light emitting element LD is located may be increased, and a region in which the light emitting element LD is located may be further limited between the first insulating pattern INSP1 and the second insulating pattern INSP2. Accordingly, the eccentricity defect in which the light emitting element LD is located closer to either side may be more effectively prevented, and the reliability of the display device can be improved.

Figure 16:
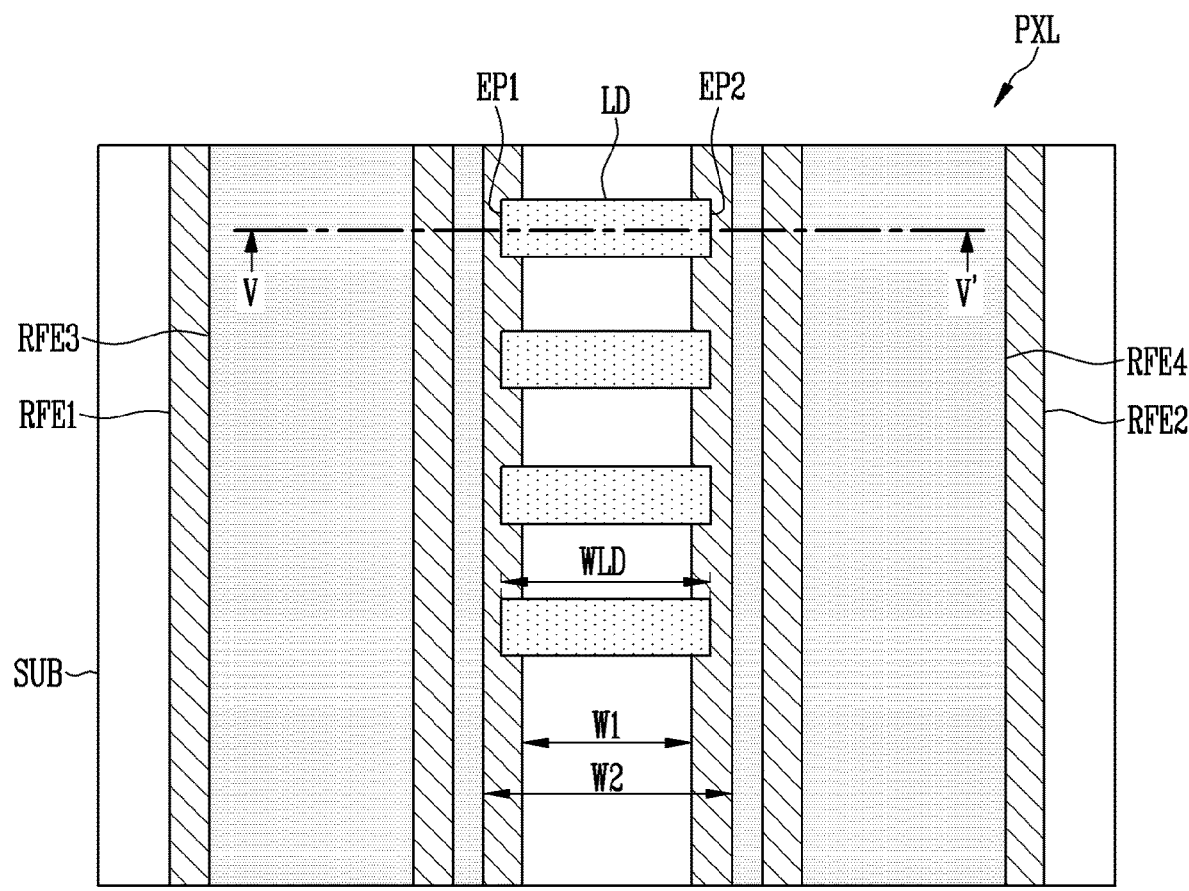
FIG. 16 is a plan view schematically illustrating a pixel according to still another embodiment of the present disclosure.
Figure 17:
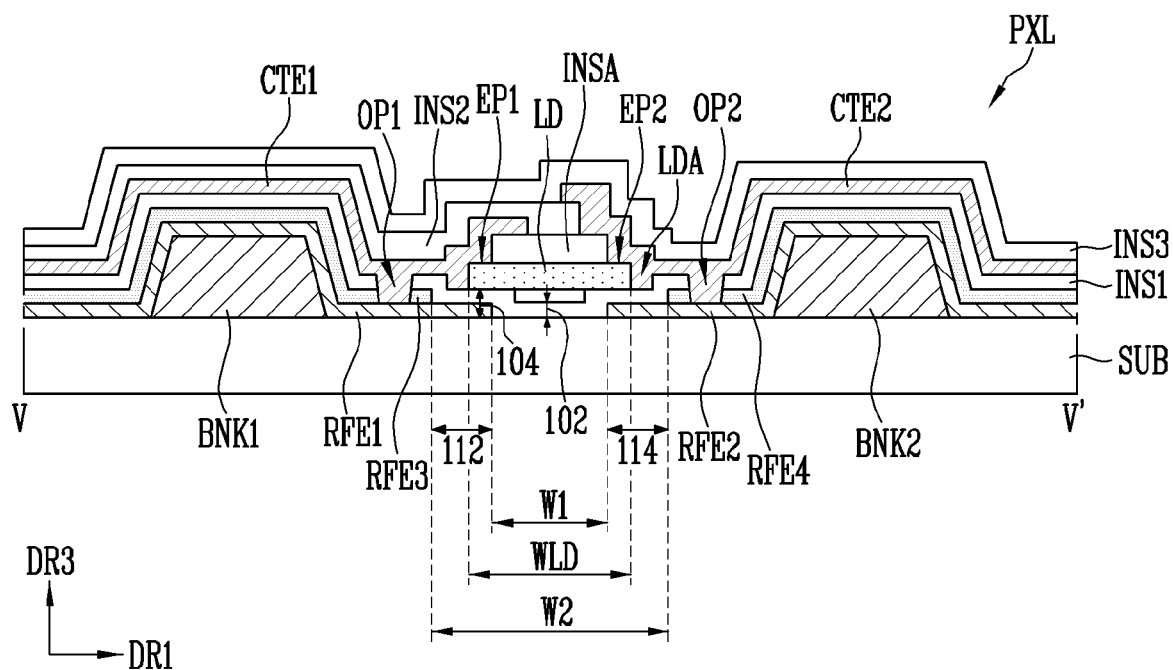
FIGS. 17 and 18 are cross-sectional views taken along the line V-V' of FIG. 16.
Figure 18:
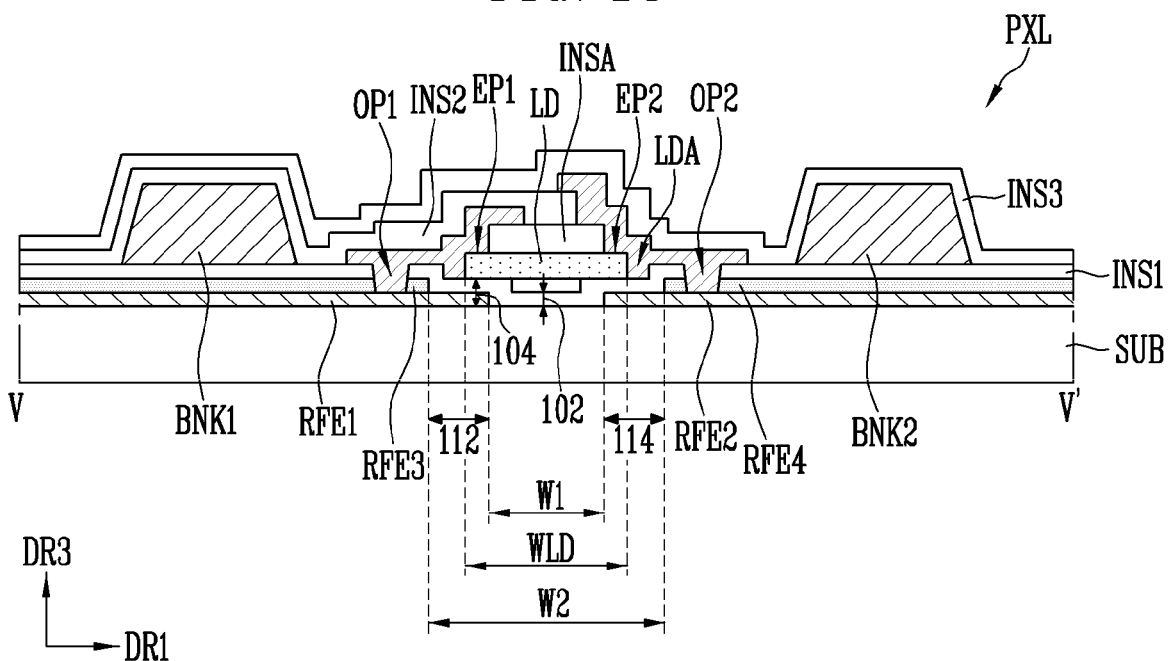

FIGS. 16-18 may be drawings illustrating a pixel PXL according to still another embodiment. FIG. 16 is a plan view schematically illustrating a pixel according to still another embodiment of the present disclosure. FIGS. 17 and 18 are cross-sectional views taken along the line V-V' of FIG. 16. In FIG. 16, a structure of the pixel PXL is schematically shown for convenience of description.

In the pixel PXL having the structure according to FIGS. 16-18, the first bank BNK1 and the second bank BNK2 may not overlap the first opening OP1 and the second opening OP2, respectively.

First, referring to FIGS. 16 and 17, the first opening OP1 may not be positioned on the first bank BNK1. The first opening OP1 may not overlap the first bank BNK1. The second opening OP2 may not be positioned on the second bank BNK2. The second opening OP2 may not overlap the second bank BNK2.

The first opening OP1 may be positioned between a region in which the light emitting element LD is located and a region in which the first bank BNK1 is located when viewed on a plan. The second opening OP2 may be positioned between a region in which the light emitting element LD is located and a region in which the second bank BNK2 is located when viewed on plan.

Accordingly, the region in which the fifth electrode CTE1 and the first electrode RFE1 contact may be positioned between the first bank BNK1 and the light emitting element LD, and similarly, the region in which the sixth electrode CTE2 and the second electrode RFE2 contact may be positioned between the second bank BNK2 and the light emitting element LD. However, the region in which the first electrode RFE1 and the fifth electrode CTE1 contact is not limited to the above-described example.

The embodiment of FIG. 18 may be different from the embodiment of FIG. 17 in that the first bank BNK1 and the second bank BNK2 are positioned on the first insulating layer INS1. For example, according to the structure of the pixel PXL according to the embodiment shown in FIG. 18, the first bank BNK1 and the second bank BNK2 may be provided after the first insulating layer INS1 is formed. In such a case, because the first to fourth electrodes RFE1 to RFE4 are not positioned on the first bank BNK1 or the second bank BNK2, electrical reliability may be further improved.

Hereinafter, a method of manufacturing a display device according to one or more embodiments will be described with reference to FIGS. 19-31.

FIGS. 19-31 are cross-sectional views illustrating a method of manufacturing a display device according to one or more embodiments of the present disclosure. Each of the drawings shown in FIGS. 19-26 may be a cross-sectional view taken along the line III-III' of FIG. 12, and may be used to describe the structure shown in FIGS. 12 and 13. The drawing shown in FIG. 27 is a cross-sectional view taken along the line IV-IV' of FIG. 14, and may be used to describe the structure shown in FIGS. 14 and 15. The drawings shown in FIGS. 28-31 may be cross-sectional views taken along the line V-V of FIG. 16. In this case, FIGS. 28 and 29 may be drawings for describing the structure shown in FIGS. 16 and 17, and FIGS. 30 and 31 may be drawings for describing the structure shown in FIGS. 16 and 18.

Figure 19:
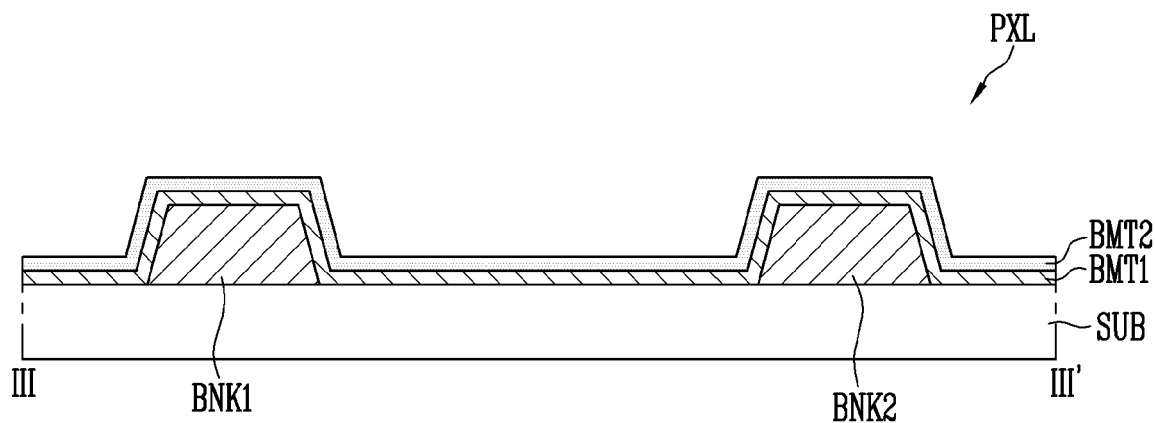
FIGS. 19-31 are cross-sectional views illustrating a method of manufacturing a display device according to one or more embodiments of the present disclosure.

Referring to FIG. 19, a first conductive layer BMT1 and a second conductive layer BMT2 may be sequentially formed on the substrate SUB. The first conductive layer BMT1 and the second conductive layer BMT2 may be formed on an entire surface of the substrate SUB.

The first conductive layer BMT1 may be a base material for forming the first electrode RFE1 and the second electrode RFE2, and include a transparent conductive material such as indium tin oxide (ITO), indium zinc oxide (IZO), zinc oxide (ZnO), and indium tin zinc oxide (ITZO).

The second conductive layer BMT2 may be directly formed on the first conductive layer BMT1. The second conductive layer BMT2 may be a base material for forming the third electrode RFE3 and the fourth electrode RFE4, and include metal such as Al, Mg, Ag, Pt, Pd, Au, Ni, Nd, Ir, Cr, Ti, or alloys thereof.

Materials constituting the first conductive layer BMT1 and the second conductive layer BMT2 are not limited to the above. The first conductive layer BMT1 and the second conductive layer BMT2 may include different materials. For example, the second conductive layer BMT2 may be made of a material having a fast side etching rate in a wet etching process, compared to the first conductive layer BMT1.

Figure 20:
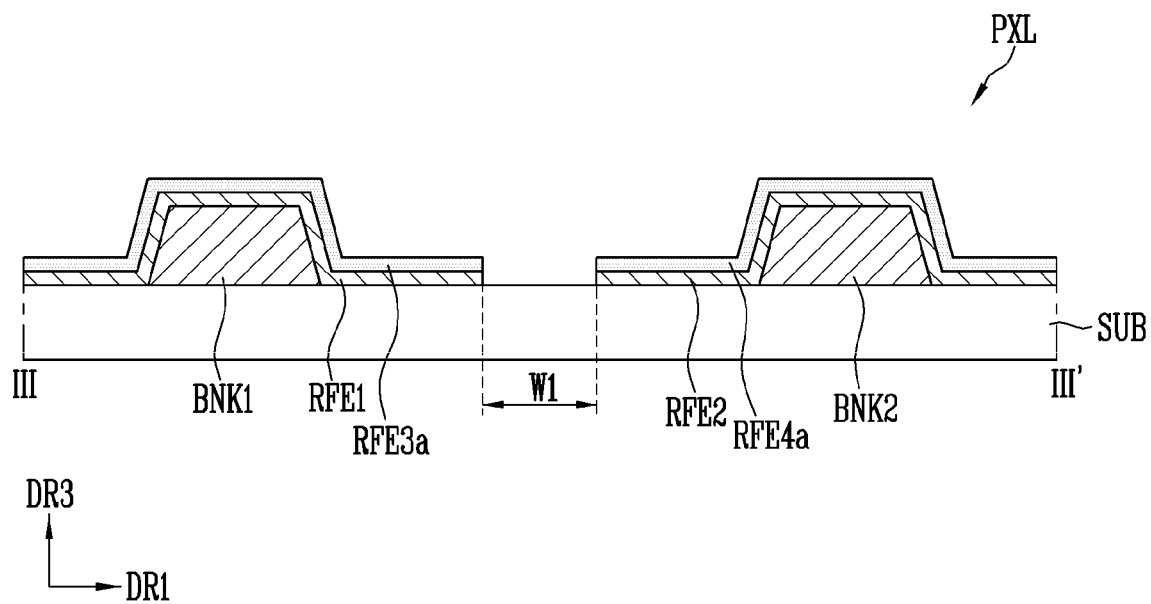

In some embodiments, before forming the first conductive layer BMT1, the first bank BNK1 and the second bank BNK2 may be formed on the substrate SUB. The first bank BNK1 and the second bank BNK2 may be spaced from each other along the first direction DR1. The space in which the light emitting element LD is to be located may be provided between the first bank BNK1 and the second bank BNK2. Referring to FIG. 20, the first conductive layer BMT1 may be etched to form a first electrode RFE1 and a second electrode RFE2, and the second conductive layer BMT2 may be etched to form a first base electrode RFE3a and a second base electrode RFE4a.

The first conductive layer BMT1 and the second conductive layer BMT2 may be etched by the same etching process (for example, a first etching process). The first conductive layer BMT1 may be etched to form the first electrode RFE1 and the second electrode RFE2 spaced from each other at the first distance W1 along the first direction DR1, and the second conductive layer BMT2 may be etched to form the first base electrode RFE3a and the second base electrode RFE4a spaced from each other in the first direction DR1.

Although not shown in the drawings, a photoresist layer PR for performing the etching process may be located on the first conductive layer BMT1 and the second conductive layer BMT2. At least a portion of the second conductive layer BMT2 may be exposed by the photoresist layer PR.

FIG. 20 shows a structure in which the first conductive layer BMT1 and the second conductive layer BMT2 are etched at the same interval. For example, the first base electrode RFE3a and the second base electrode RFE4a formed by etching the second conductive layer BMT2 may also be spaced from each other at the first distance W1, but the present disclosure is not limited thereto. As described above, because the side etching rate of the second conductive layer BMT2 may be greater than that of the first conductive layer BMT1, a distance between the first base electrode RFE3a and the second base electrode RFE4a may be greater than the first distance W1.

In one or more embodiments, when the first conductive layer BMT1 includes a transparent electrode material, the first electrode RFE1 and the second electrode RFE2 formed by the etching process may be in an amorphous state.

Figure 21:
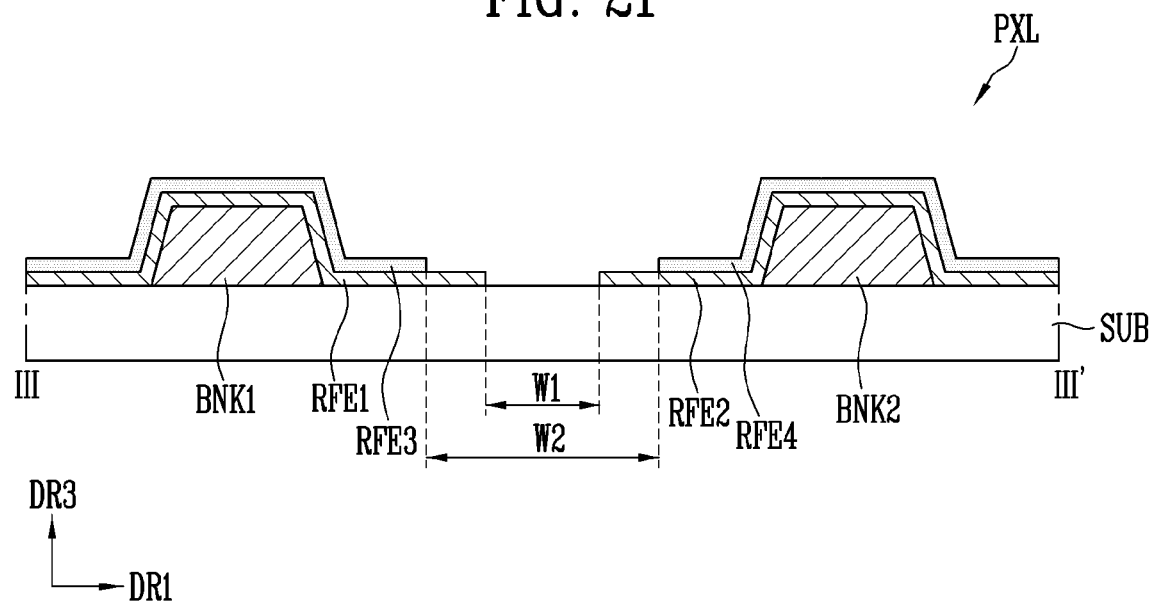

Referring to FIG. 21, the first electrode RFE1 and the second electrode RFE2 may be crystallized by performing a bake process for heating the substrate SUB, and the first base electrode RFE3a and the second base electrode RFE4a may be additionally etched to form the third electrode RFE3 and the fourth electrode RFE4.

The first conductive layer BMT1 may be etched to form the first electrode RFE1 and the second electrode RFE2, and the second conductive layer BMT2 may be etched to form the first base electrode RFE3a and the second base electrode RFE4a. Thereafter, the bake process for heating the substrate SUB may be performed. The bake process may be performed by heating the substrate SUB at a temperature of 200° C. or higher, but the heating temperature is not limited thereto, and may be 300° C. or higher.

Through this, the amorphous first and second electrodes RFE1 and RFE2 may be crystallized. Because the crystallized first and second electrodes RFE1 and RFE2 have improved electron conduction characteristics compared to the amorphous electrodes, electron mobility can be improved. Further, the crystallized first and second electrodes RFE1 and RFE2 may not be etched in an etching process to be described later.

The first electrode RFE1 and the second electrode RFE2 may be crystallized through the bake process, and the first base electrode RFE3a and the second base electrode RFE4a may be additionally etched through an additional etching process (for example, a second etching process). In such a case, the photoresist layer located on the first base electrode RFE3a and the second base electrode RFE4a may be the same as the photoresist layer used in the first etching process. For example, after the first etching process, the photoresist layer is not removed, and the second etching process may be performed.

As described above, the crystallized first and second electrodes RFE1 and RFE2 are not etched, and only the first and second base electrodes RFE3a and RFE4a are etched, so that the third electrode RFE3 and the fourth electrode RFE4 may be formed. The third electrode RFE3 and the fourth electrode RFE4 may be spaced from each other at the second distance W2 along the first direction DR1. The second distance W2 may be greater than the first distance W1 between the first electrode RFE1 and the second electrode RFE2.

The first and second electrodes RFE1 and RFE2 may be spaced from each other at the first distance W1, and the third and fourth electrodes RFE3 and RFE4 may be spaced from each other at the second distance W2. Therefore, the steps may be generated between the first and second electrodes RFE1 and RFE2 and the third and fourth electrodes RFE3 and RFE4. These steps may limit the space in which the light emitting element LD can be located, which will be described later.

Figure 22:
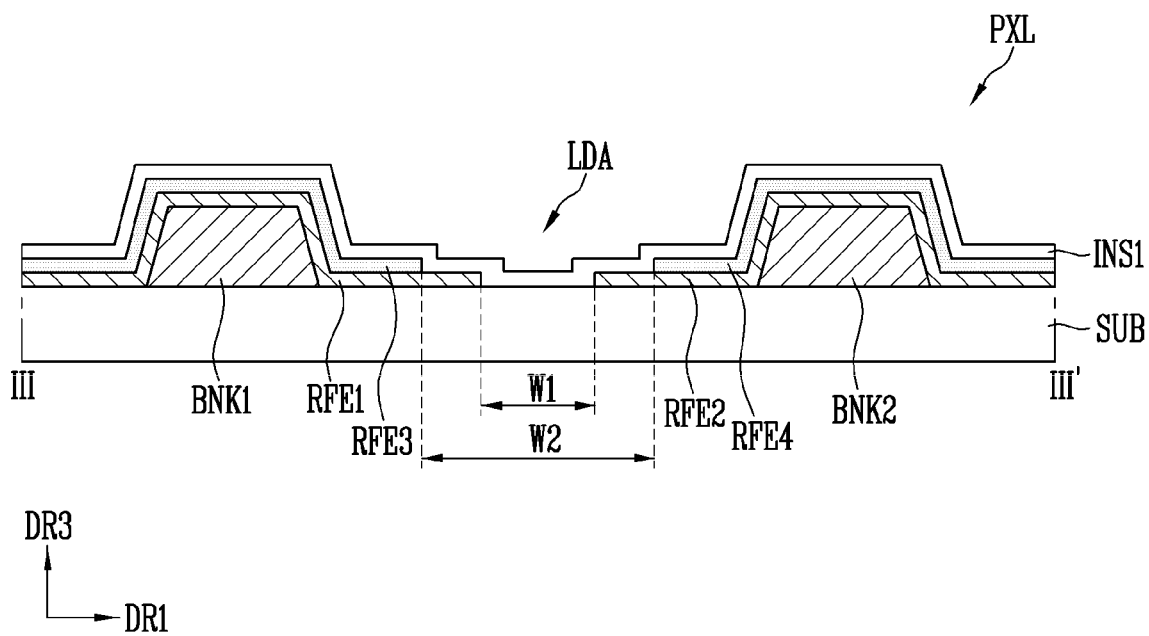

Referring to FIG. 22, the first insulating layer INS1 may be formed. The first insulating layer INS1 may be formed on the entire surface of the substrate SUB. The first insulating layer INS1 may entirely cover the components located on the substrate SUB. For example, the first insulating layer INS1 may cover the first to fourth electrodes RFE1 to RFE4. As described above, the first insulating layer INS1 may include an inorganic material or an organic material.

The first insulating layer INS1 may be formed to correspond to shapes of the steps between the first and second electrodes RFE1 and RFE2 and the third and fourth electrodes RFE3 and RFE4, and the light emitting element region LDA may be provided between a first step between the first electrode RFE1 and the third electrode RFE3 and a second step between the second electrode RFE2 and the fourth electrode RFE4.

Figure 23:
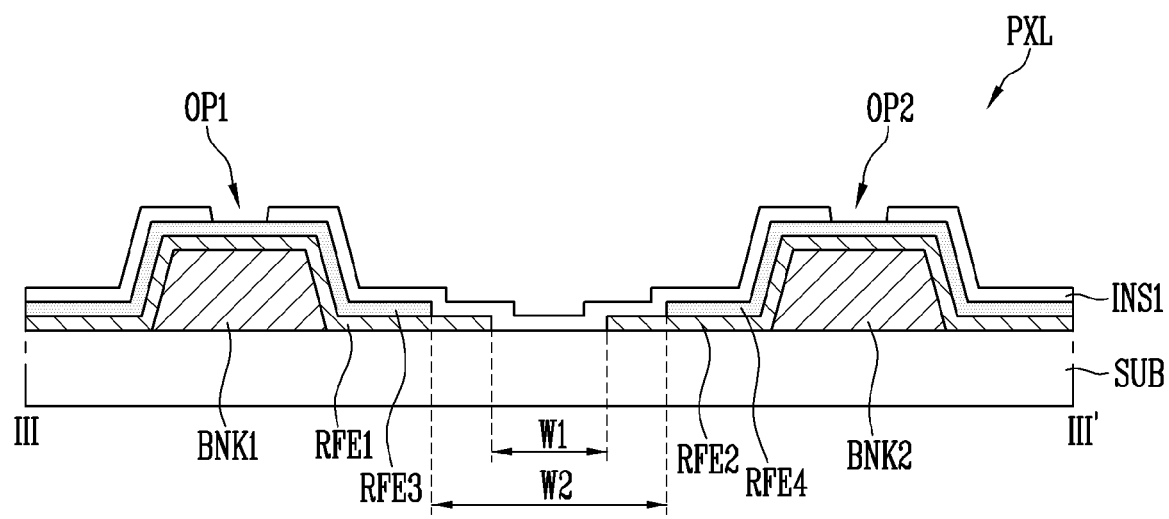

Referring to FIG. 23, at least a portion of the first insulating layer INS1 may be removed. At least a portion of the first insulating layer INS1 may be removed by a dry etching process, so that the first opening OP1 and the second opening OP2 may be provided in the first insulating layer INS1.

The region from which at least a portion of the first insulating layer INS1 is removed may overlap a region in which the fifth electrode CTE1 to be provided later contacts the first electrode RFE1. For example, a process for etching the first insulating layer INS1 positioned in the region where the fifth electrode CTE1 is to be connected to the first electrode RFE1 may be performed. In some embodiments, the region from which at least a portion of the first insulating layer INS1 is removed may overlap a region in which the sixth electrode CTE2 to be provided later contacts the second electrode RFE2. For example, a process for etching the first insulating layer INS1 positioned in the region where the sixth electrode CTE2 is to be connected to the second electrode RFE2 may be performed.

Figure 24:
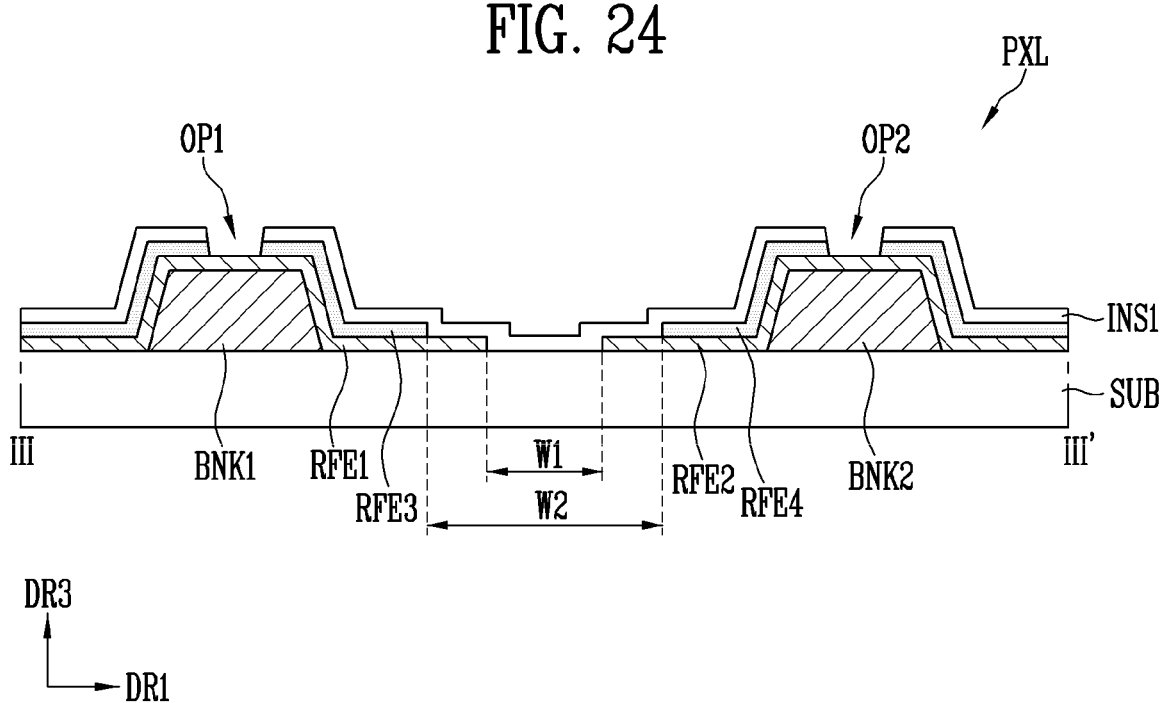

Referring to FIG. 24, at least a portion of each of the third electrode RFE3 and the fourth electrode RFE4 may be removed. At least a portion of the third electrode RFE3 may be removed so that the first opening OP1 may be included in the third electrode RFE3. At least a portion of the fourth electrode RFE4 may be removed so that the second opening OP2 may be included in the fourth electrode RFE4.

The process of removing at least a portion of each of the third electrode RFE3 and the fourth electrode RFE4 may be performed at the same time as the cutting process for forming the pixel electrode.

In this step, the region from which the third electrode RFE3 is removed may overlap the position of the first opening OP1 formed in the first insulating layer INS1. In this step, the region from which the fourth electrode RFE4 is removed may overlap the position of the second opening OP2 formed in the first insulating layer INS1.

For example, in this step, a process for etching the third and fourth electrodes RFE3 and RFE4 may be performed. In this case, layers (for example, the third electrode RFE3 in which the first opening OP1 is not formed) positioned in a region where the first opening OP1 and the second opening OP2 are not formed may be covered by the first insulating layer INS1 and may not be removed by the etching process.

Figure 25:
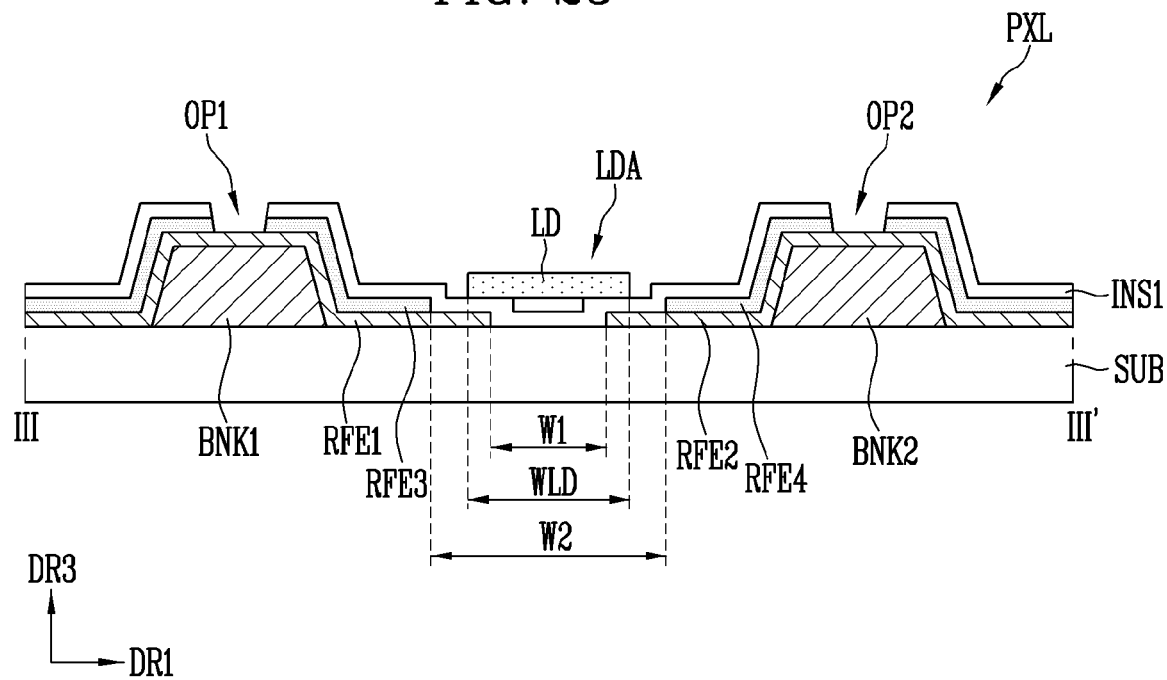

According to this step, the first opening OP1 may be provided in the first insulating layer INS1 and the third electrode RFE3, and the second opening OP2 may be provided in the first insulating layer INS1 and the fourth electrode RFE4. Referring to FIG. 25, the light emitting element LD may be aligned on the insulating layer INS1. Before the light emitting element LD is aligned, the light emitting element LD may be provided in a mixed state in a solution. The solution including the light emitting element LD may be discharged onto the first insulating layer INS1 by an inkjet printing method.

In such a case, a first alignment voltage may be applied to the first electrode RFE1 and the third electrode RFE2, and a second alignment voltage may be applied to the second electrode RFE2 and the fourth electrode RFE4. For example, one of the first alignment voltage and the second alignment voltage may be an AC voltage, and the other one may be a DC voltage (or a ground voltage). The light emitting element LD in the solution may be aligned between the first electrode RFE1 and the second electrode RFE2 (or between the third electrode RFE3 and the fourth electrode RFE4) according to a potential difference between the first alignment voltage and the second alignment voltage.

In the alignment process, a position where the light emitting element LD is aligned may be limited to the light emitting element region LDA provided between the first step of the first electrode RFE1 and the third electrode RFE3 and the second step of the second electrode RFE2 and the fourth electrode RFE4. Through this, the display device in which the light emitting element LD is aligned at the accurate position can be manufactured.

In one or more embodiments, the length WLD of the light emitting element LD may be greater than the first distance W1 between the first and second electrodes RFE1 and RFE2, and may be less than the second distance W2 between the third and fourth electrodes RFE3 and RFE4. Accordingly, at least a portion of the first electrode RFE1 and at least a portion of the second electrode RFE2 may overlap the light emitting element LD in the third direction DR3, respectively, and the third and fourth electrodes RFE3 and RFE4 may not overlap the light emitting element LD in the third direction DR3.

Figure 26:
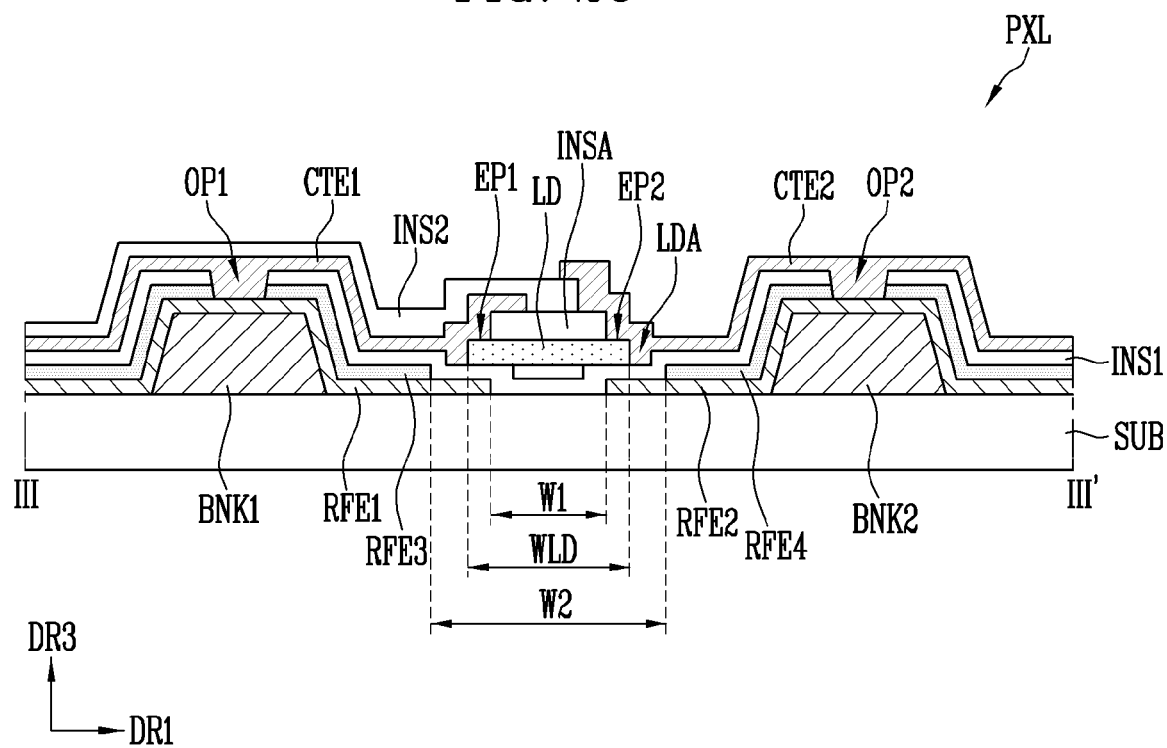
Figure 27:
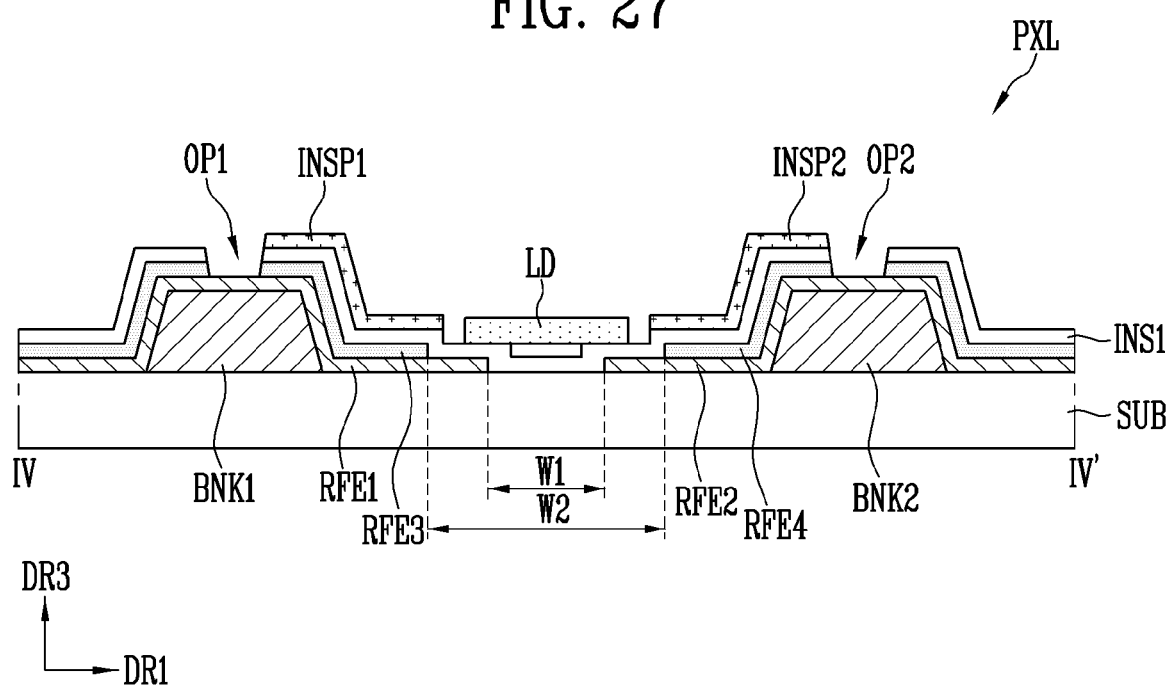

Thereafter, referring to FIG. 26, the fifth electrode CTE1 and the sixth electrode CTE2 may be arranged. In this case, the fifth electrode CTE1 may be connected to the first electrode RFE1 through the first opening OP1 formed in the first insulating layer INS1 and the third electrode RFE3. The sixth electrode CTE2 may be connected to the second electrode RFE2 through the second opening OP2 formed in the first insulating layer INS1 and the fourth electrode RFE4. Also, after the fifth electrode CTE1 is arranged, before the sixth electrode CTE2 is arranged, the second insulating layer INS2 may be positioned to cover the fifth electrode CTE1. Thereafter, although not shown in the drawings, the third insulating layer INS3 may be located on an entire surface of the second insulating layer INS2 and the sixth electrode CTE2. Accordingly, the pixel PXL and the display device including the same according to the embodiment of FIGS. 12 and 13 may be manufactured.

Next, a method of manufacturing a display device according to another embodiment of the present disclosure will be described with reference to FIG. 27 together with the embodiment described in FIGS. 14 and 15.

As shown in FIG. 27, a pixel PXL may be manufactured by further forming the first insulating pattern INSP1 and the second insulating pattern INSP2 on the insulating layer INS1.

For example, after forming the insulating layer INS1 on the first to fourth electrodes RFE1, RFE2, RFE3, and RFE4, the first insulating pattern INSP1 and the second insulating pattern INSP2 may be formed before aligning the light emitting element LD.

The first insulating pattern INSP1 and the second insulating pattern INSP2 may be spaced from each other along the first direction DR1 on the first insulating layer INS1 and may cover at least a portion of the insulating layer INS1.

According to the present embodiment, the heights of the steps generated in the insulating layer INS1 may be further increased by the first and second insulating patterns INSP1 and INSP2. For example, the height of the recess (or the light emitting element region LDA) in which the light emitting element LD is located may be increased, and the region in which the light emitting element LD is located may be further limited between the first insulating pattern INSP1 and the second insulating pattern INSP2. Accordingly, the eccentricity defect in which the light emitting element LD is located closer to either side may be more effectively prevented, and the reliability of the display device can be improved.

The first insulating pattern INSP1 and the second insulating pattern INSP2 may be an organic insulating layer including an organic material or an inorganic insulating layer including an inorganic material. When the first insulating pattern INSP1 and the second insulating pattern INSP2 are made of the organic insulating layer, the manufacturing process of the display device may be simplified.

Before aligning the light emitting element LD, the dry etching process for forming the first and second openings OP1 and OP2 of the insulating layer INS1 shown in FIG. 8 may be additionally performed. The first insulating pattern INSP1 and the second insulating pattern INSP2 may be concurrently (e.g., simultaneously) formed in the process of forming the first and second openings OP1 and OP2. For example, when the first insulating pattern INSP1 and the second insulating pattern INSP2 include the organic insulating layer, a separate photo process or an etching process for forming the first insulating pattern INSP1 and the second insulating pattern INSP2 may not be necessary. Accordingly, the manufacturing process of the display device can be simplified and the manufacturing cost of the display device can be reduced.

Thereafter, although not shown in the drawings, processes for positioning the fifth electrode CTE1, the sixth electrode CTE2, the second insulating layer INS2, and the third insulating layer INS3 may be additionally performed. Accordingly, the pixel PXL and the display device 1000 including the same according to the embodiment of FIGS. 14 and 15 may be manufactured.

Next, a method of manufacturing a display device according to still another embodiment of the present disclosure will be described with reference to FIGS. 28 and 29 together with the embodiment described with reference to FIGS. 16 and 17.

Figure 28:
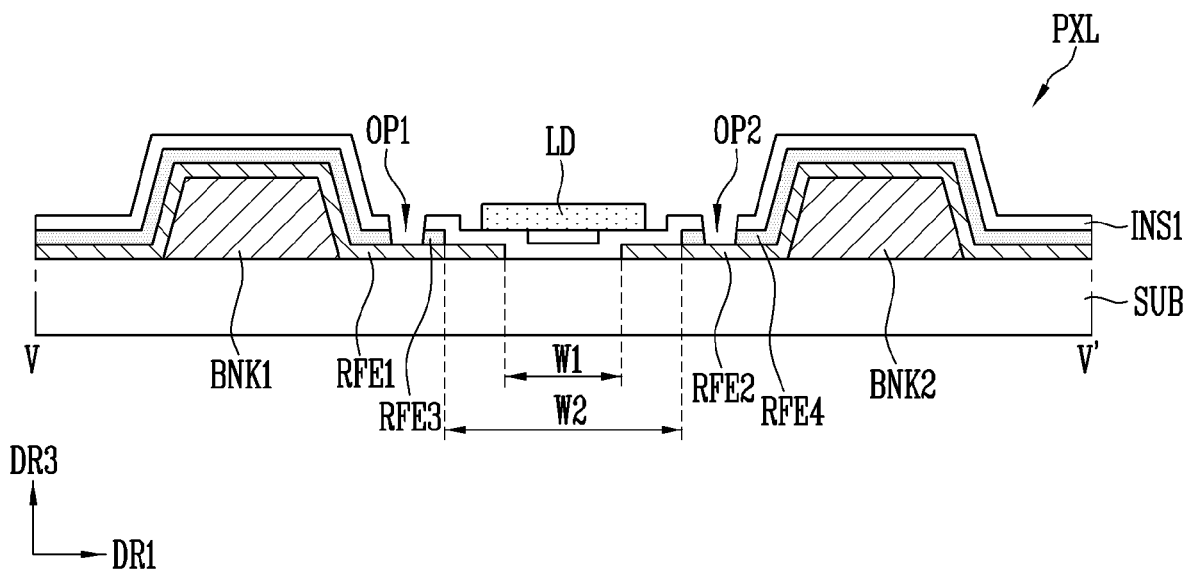

Referring to FIG. 28, the first bank BNK1, the second bank BNK2, the first to fourth electrodes RFE1 to RFE4, and the first insulating layer INS1 may be formed on the substrate SUB.

Thereafter, a dry etching process may be performed to provide the first opening OP1 in the first insulating layer INS1 and the third electrode RFE3, and the second opening OP2 in the first insulating layer INS1 and the fourth electrode RFE4. Accordingly, the first electrode RFE1 may be exposed through the first opening OP1, and the second electrode RFE2 may be exposed through the second opening OP2.

In this case, according to the present embodiment (e.g., see FIG. 28), the first opening OP1 may be formed not to overlap the first bank BNK1, and the second opening OP2 may be formed not to overlap the second bank BNK2. For example, the first opening OP1 may be positioned between the first bank BNK1 and the light emitting element LD, and the second opening OP2 may be positioned between the second bank BNK2 and the light emitting element LD.

Figure 29:
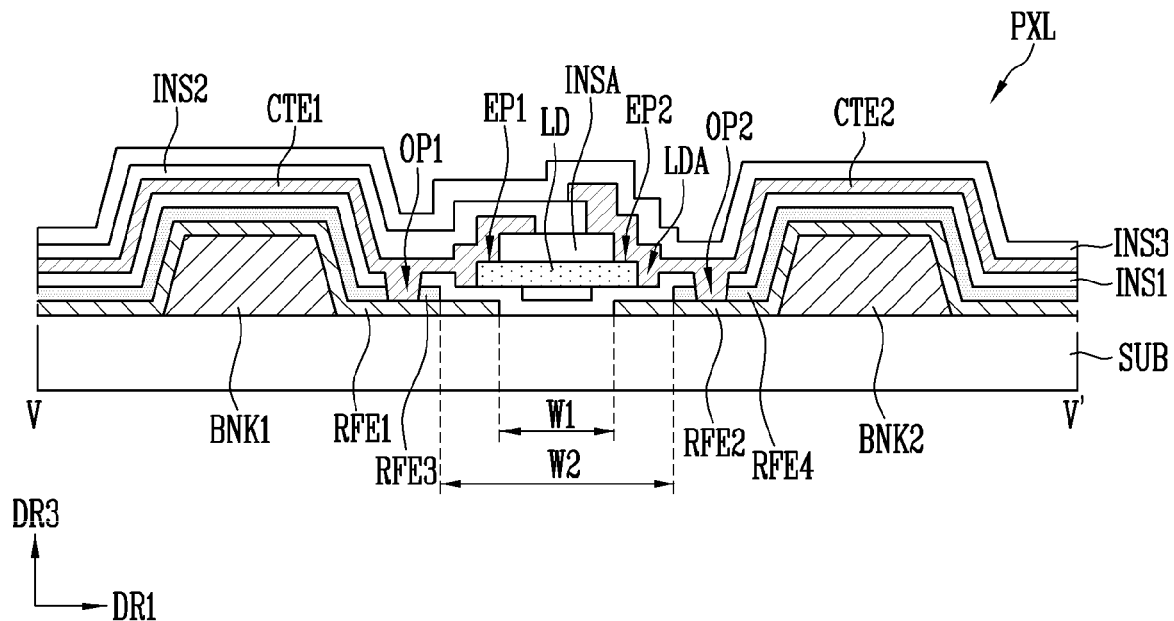

Referring to FIG. 29, the fifth electrode CTE1 and the sixth electrode CTE2 may be formed. In such a case, the region where the fifth electrode CTE1 and the first electrode RFE1 are connected may overlap the first opening OP1. Also, the region where the sixth electrode CTE2 and the second electrode RFE2 are connected may overlap the second opening OP2. The fifth electrode CTE1 may be connected to the first electrode RFE1 through the first opening OP1 that does not overlap the first bank BNK1, and the sixth electrode CTE2 may be connected to the second electrode RFE2 through the second opening OP2 that does not overlap the second bank BNK2.

Thereafter, the second insulating layer INS2 and the third insulating layer INS3 may be located. Accordingly, the pixel PXL and the display device 1000 including the same according to the embodiment of FIGS. 16 and 17 may be manufactured.

Next, a method of manufacturing a display device according to still another embodiment of the present disclosure will be described with reference to FIGS. 30 and 31 together with the embodiment described with reference to FIGS. 16 and 18.

Figure 30:
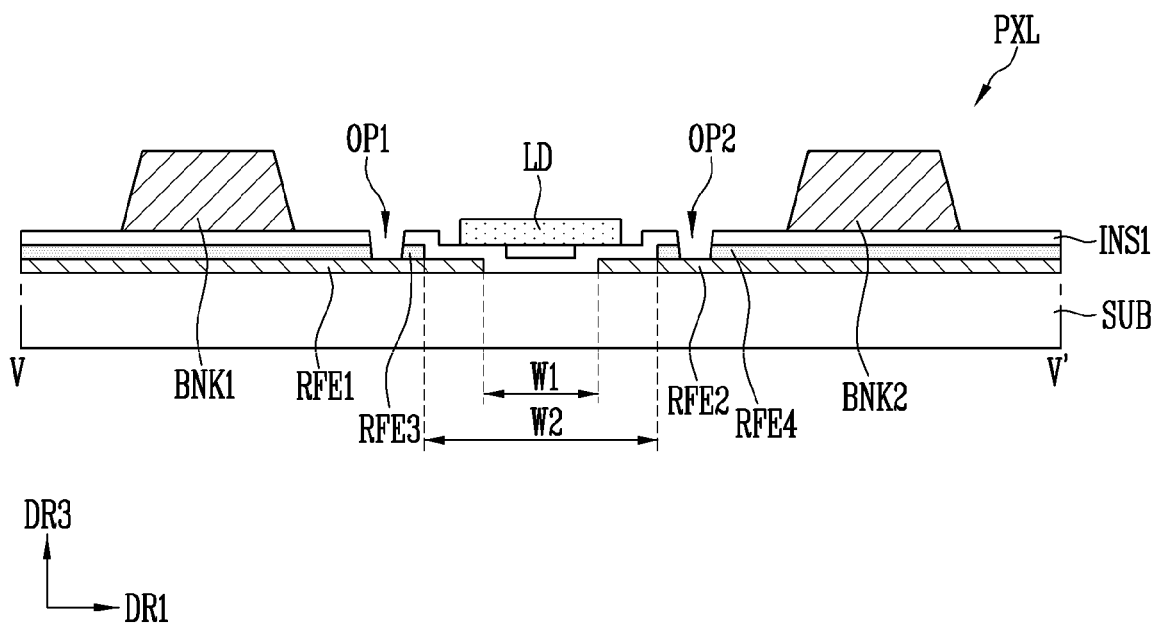

Referring to FIG. 30, the first to fourth electrodes RFE1 to RFE4 and the first insulating layer INS1 may be formed on the substrate SUB. Thereafter, the first bank BNK1 and the second bank BNK2 may be located on the first insulating layer INS1. According to the embodiment shown in FIGS. 30 and 31, unlike the embodiment shown in FIGS. 28 and 29, the first bank BNK1 and the second bank BNK2 may be positioned on the first insulating layer INS1.

After the first bank BNK1 and the second bank BNK2 are located, the first opening OP1 may be formed in the first insulating layer INS1 and the third electrode RFE3, and the second opening OP2 may be formed in the first insulating layer INS1 and the fourth electrode RFE4.

However, the present disclosure is not limited thereto. According to some embodiments, after forming the first opening OP1 and the second opening OP2 in each of the first insulating layer INS1, the third electrode RFE3, and the fourth electrode RFE4, the first bank BNK1 and the second bank BNK2 may be arranged. In this case, the first opening OP1 may be positioned between the first bank BNK1 and the light emitting element LD, and the second opening OP2 may be positioned between the second bank BNK2 and the light emitting element LD. For example, according to the present embodiment (e.g., see FIGS. 30-31), the first bank BNK1 and the second bank BNK2 may be positioned on the first insulating layer INS1, but the first opening OP1 may be positioned between the light emitting element LD and the first bank BNK1, and the second opening OP2 may be positioned between the light emitting element LD and the second bank BNK2.

Figure 31:
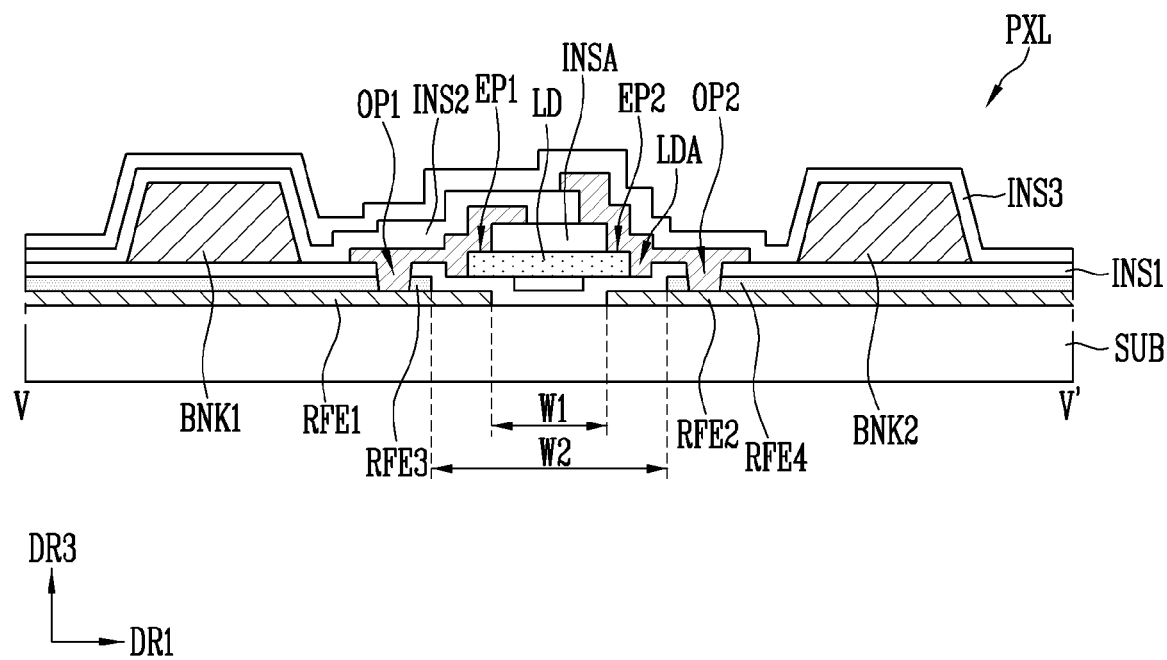

Thereafter, referring to FIG. 31, the fifth electrode CTE1 may contact the first electrode RFE1 through the first opening OP1, and the sixth electrode CTE2 may contact the second electrode RFE2 through the second opening OP2. In one or more embodiments, by disposing the second insulating layer INS2 and the third insulating layer INS3, the pixel PXL and the display device 1000 including the same according to the embodiment of FIGS. 16 and 18 may be manufactured.

According to one or more embodiments of the present disclosure, by arranging the light emitting element in the accurate position, the display device with improved reliability and the method of manufacturing the same may be provided.

According to another embodiment of the present disclosure, the display device with improved reliability of an electrical signal and the method of manufacturing the same may be provided.

Aspects of the present disclosure are not limited to the above-described embodiments, and aspects that are not mentioned will be clearly understood by those of ordinary skill in the art from the present disclosure and the accompanying drawings.

The above description is merely illustrative of the technical spirit of the present disclosure, and those of ordinary skill in the art to which the present disclosure pertains will be able to make various modifications and changes without departing from the essential features of the present disclosure. Accordingly, the embodiments of the present disclosure described above may be implemented separately or in combination with each other.

Accordingly, the embodiments disclosed in the present disclosure are not intended to limit the technical spirit of the present disclosure, but to explain the technical spirit. The scope of the technical spirit of the present disclosure is not limited by these embodiments. The scope of protection of the present disclosure should be interpreted by the following claims, and all technical spirits within the scope equivalent thereto should be construed as being included in the scope of the present disclosure.

What is claimed is:

1. A display device comprising:
a substrate;
a first electrode and a second electrode on the substrate and spaced from each other at a first distance along a first direction;
a third electrode and a fourth electrode on the first electrode and the second electrode, respectively, and spaced from each other at a second distance along the first direction; and
a light emitting element located between the third electrode and the fourth electrode in a plan view; and
a first insulating layer on the third electrode and the fourth electrode,
wherein the second distance is greater than the first distance,
wherein at least a portion of the first electrode and at least a portion of the second electrode located between the substrate and the light emitting element in a thickness direction of the substrate is spaced from the light emitting element in the thickness direction of the substrate and overlap the light emitting element in the thickness direction of the substrate, and
wherein the light emitting element is on the first insulating layer.

2. The display device of claim 1, wherein the first electrode and the second electrode comprise a same material, and
wherein the third electrode and the fourth electrode comprise a material different from the first electrode and the second electrode.

3. The display device of claim 2, wherein the first electrode and the second electrode comprise at least one of indium tin oxide (ITO), indium zinc oxide (IZO), zinc oxide (ZnO), and indium tin zinc oxide (ITZO).

4. The display device of claim 2, wherein the third electrode and the fourth electrode comprise at least one of Ag, Mg, Al, Pt, Pd, Au, Ni, Nd, Ir, Cr, Li, Ca, LiF/Ca, LiF/Al, Mo, Ti, and Cu.

5. The display device of claim 1, wherein the third electrode contacts the first electrode, and the fourth electrode contacts the second electrode.

6. The display device of claim 1, further comprising:
a first insulating pattern and a second insulating pattern on the first insulating layer and spaced from each other along the first direction,
wherein the light emitting element is between the first insulating pattern and the second insulating pattern.

7. The display device of claim 1, further comprising:
a fifth electrode contacting the first electrode and a first end of the light emitting element; and
a sixth electrode contacting the second electrode and a second end of the light emitting element.

8. The display device of claim 7, wherein the fifth electrode and the sixth electrode are on the first insulating layer,
wherein the first insulating layer and the third electrode comprise a first opening exposing at least a portion of the first electrode,
wherein the first insulating layer and the fourth electrode comprise a second opening exposing at least a portion of the second electrode,
wherein the fifth electrode is connected to the first electrode through the first opening, and
wherein the sixth electrode is connected to the second electrode through the second opening.

9. The display device of claim 7, further comprising:
an anchoring layer on the light emitting element,
wherein the anchoring layer contacts at least a portion of an outer peripheral surface of the light emitting element, and exposes the first end and the second end of the light emitting element.

10. The display device of claim 1, further comprising:
a first bank between the first electrode and the substrate and overlapping the first electrode and the third electrode; and
a second bank between the second electrode and the substrate and overlapping the second electrode and the fourth electrode.

11. The display device of claim 8, further comprising:
a first bank and a second bank on the first insulating layer and each having a shape protruding in a display direction of the light emitting element,
wherein the first opening is positioned between the first bank and the light emitting element, and
wherein the second opening is positioned between the second bank and the light emitting element.

12. A display device comprising:
a substrate;
a first electrode and a second electrode on the substrate and spaced from each other at a first distance along a first direction;
a third electrode and a fourth electrode on the first electrode and the second electrode, respectively, and spaced from each other at a second distance along the first direction; and
a light emitting element located between the third electrode and the fourth electrode in a plan view
wherein the second distance is greater than the first distance,
wherein at least a portion of the first electrode and at least a portion of the second electrode located between the substrate and the light emitting element in a thickness direction of the substrate is spaced from the light emitting element in the thickness direction of the substrate and overlap the light emitting element in the thickness direction of the substrate,
wherein a length of the light emitting element in the first direction is greater than the first distance and less than the second distance, and
wherein the portion of the first electrode and the second electrode located between the substrate and the light emitting element in the thickness direction comprises at least a portion of the first electrode and at least a portion of the second electrode that overlap the light emitting element.

13. A display device comprising:
a substrate;
a first electrode and a second electrode on the substrate;
a third electrode on the first electrode and having a first opening exposing at least a portion of the first electrode;
a fourth electrode on the second electrode and having a second opening exposing at least a portion of the second electrode;
a light emitting element located between the third electrode and the fourth electrode when viewed on a plan and capable of emitting light in a display direction;
a fifth electrode having at least a portion electrically connected to one end of the light emitting element, I the fifth electrode being on the third electrode; and
a sixth electrode having at least a portion electrically connected to an other end of the light emitting element, the sixth electrode being on the fourth electrode,
wherein the fifth electrode is connected to the first electrode through the first opening, and
wherein the sixth electrode is connected to the second electrode through the second opening.

14. The display device of claim 13, wherein the first electrode and the fifth electrode comprise a first material, and
wherein the second electrode and the sixth electrode comprise a second material.

15. The display device of claim 14, wherein the first material and the second material comprise at least one of indium tin oxide (ITO), indium zinc oxide (IZO), zinc oxide (ZnO), and indium tin zinc oxide (ITZO).

16. The display device of claim 13, further comprising:
an emission region through which light can be emitted;
a non-emission region that is a region other than the emission region; and
a partition wall having a shape protruding in the display direction and defining the emission region,
wherein the first opening and the second opening are in the non-emission region.

17. The display device of claim 16, wherein the first opening and the second opening overlap the partition wall.

18. The display device of claim 16, wherein the non-emission region comprises a region in which at least a portion of the first electrode or the second electrode is cut.

19. The display device of claim 16, further comprising:
a bank arranged in the emission region and having a shape protruding in the display direction,
wherein at least a portion of each of the first electrode and the second electrode is positioned on the bank, and
wherein the first opening and the second opening do not overlap the bank.

* * * * *